United States Patent
Kaminaga et al.

(10) Patent No.: US 9,735,368 B2
(45) Date of Patent: Aug. 15, 2017

(54) ORGANIC ELECTROLUMINESCENT DEVICES

(71) Applicant: UDC Ireland Limited, Dublin (IE)

(72) Inventors: Kuniyuki Kaminaga, Kanagawa (JP); Wataru Sotoyama, Kanagawa (JP); Masaru Kinoshita, Kanagawa (JP); Daisuke Inoue, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 723 days.

(21) Appl. No.: 13/932,595

(22) Filed: Jul. 1, 2013

(65) Prior Publication Data

US 2014/0008621 A1  Jan. 9, 2014

(30) Foreign Application Priority Data

Jul. 9, 2012  (JP) ................. 2012-153732

(51) Int. Cl.
*H01L 51/50* (2006.01)
*H01L 51/00* (2006.01)
(Continued)

(52) U.S. Cl.
CPC .......... *H01L 51/0052* (2013.01); *C09K 11/06* (2013.01); *H01L 51/0058* (2013.01);
(Continued)

(58) Field of Classification Search
None
See application file for complete search history.

(56) References Cited

U.S. PATENT DOCUMENTS

| | | | |
|---|---|---|---|
| 2004/0137270 A1* | 7/2004 | Seo ................. | C09K 11/06 428/690 |
| 2010/0052526 A1* | 3/2010 | Je ................... | C07C 211/61 313/504 |

FOREIGN PATENT DOCUMENTS

| | | |
|---|---|---|
| JP | 2003347058 | 12/2003 |
| JP | 2008153088 | 7/2008 |

(Continued)

OTHER PUBLICATIONS

Kim et al., Exceedingly efficient dep-blue electroluminescence from new anthracenes obtained using rational molecular design, 2008, J. Material Chemistry, vol. 18, p. 3376-3384.*

*Primary Examiner* — Gregory Clark
(74) *Attorney, Agent, or Firm* — Riverside Law LLP

(57) ABSTRACT

An organic electroluminescent element that includes a light-emitting layer composed of a light-emitting composition containing at least one type of host material and at least one type of light-emitting material is provided. The host material is a fluorescent anthracene derivative, which fluoresces blue light under DC current with a current density of 25 mA/cm$^2$. If λ (nm) is taken to be the shortest wavelength of all the wavelengths at which the intensity of PL emission of a film composed only of the aforementioned host material is one-half the maximum emission intensity, then the intensity of PL emission at the aforementioned wavelength λ of a film composed of the aforementioned light-emitting composition is no more than 1/10 the maximum emission intensity of PL emission of the film composed of the aforementioned light-emitting composition, and the PL emission of the film composed of the aforementioned light-emitting composition satisfies CIE y≤0.08.

12 Claims, 2 Drawing Sheets

(51) Int. Cl.
*C09K 11/06* (2006.01)
*H05B 33/14* (2006.01)
(52) U.S. Cl.
CPC ......... *H01L 51/5012* (2013.01); *H05B 33/14* (2013.01); *C09K 2211/1007* (2013.01); *C09K 2211/1011* (2013.01); *C09K 2211/1014* (2013.01); *H01L 51/006* (2013.01); *H01L 51/0073* (2013.01)

(56) References Cited

FOREIGN PATENT DOCUMENTS

| | | |
|---|---|---|
| JP | 2010059147 | 3/2010 |
| JP | 2011529455 | 12/2011 |
| JP | 2012-119592 | 6/2012 |
| JP | 2012190863 | 10/2012 |

* cited by examiner

ORGANIC ELECTROLUMINESCENT DEVICES

CROSS-REFERENCE TO RELATED APPLICATIONS

The present U.S. patent application claims priority benefit from Japanese Patent Appl. No. 2012-153732, filed 9 Jul. 2012, which is incorporated by reference herein in its entirety.

TECHNICAL FIELD

The present invention relates to an organic electroluminescent element (hereinafter also referred to as an organic EL element).

BACKGROUND ART

Organic electroluminescent elements have been the subject of a great deal of research and development because they emit very bright light at a low voltage drive. An organic electroluminescent element is such that there is an organic layer between a pair of electrodes, electrons injected from the cathode and holes injected from the anode are rebonded at the organic layer, and the exciton energy thus generated is utilized to emit light.

One of the main problems with the practical application of organic electroluminescent elements is increasing their durability. In particular, blue light-emitting elements that give blue color generally have low heat-resistance durability. Elements which use an anthracene derivative or another such condensed aromatic hydrocarbon compound as the host material have been studied for the purpose of increasing the durability of a light-emitting element.

Organic electroluminescent elements in which an anthracene derivative or another condensed aromatic hydrocarbon compound is used as a host are proposed in Patent Documents 1 to 3. Blue organic electroluminescent elements in which an anthracene derivative is used as a host are proposed in Patent Documents 4 and 5.

RELATED ART DOCUMENTS

Patent Documents

Patent Document 1: Japanese Laid-Open Patent Application 2003-236516
Patent Document 2: Japanese Laid-Open Patent Application 2003-347058
Patent Document 3: Japanese Laid-Open Patent Application 2010-059147
Patent Document 4: Japanese Translation of PCT International Application 2011-529455
Patent Document 5: International Laid-Open Patent Application 2008-153088

SUMMARY OF THE INVENTION

Problems to be Solved by the Invention

However, investigation on the part of the present inventors has revealed that the organic electroluminescent elements described in Patent Documents 1 to 5 have the problem of either inadequate durability or insufficient color purity. In particular, in the field of blue light-emitting elements, there have yet to be discovered general guidelines for providing an element that is satisfactory at a high level in terms of the durability and color purity of the element.

It is an object of the present invention to solve the aforementioned problems encountered in the past and to achieve the following object: Specifically, it is an object to provide an organic electroluminescent element with which both good durability and high color purity of the element can be achieved. In particular, it is an object to provide a blue organic electroluminescent element with which both good durability and high color purity of the element can be achieved.

Means for Solving the Problems

Investigation on the part of the present inventors has led to the discovery that the aforementioned problems can be solved by employing an organic electroluminescent element that includes a light-emitting layer composed of a light-emitting composition containing at least one type of host material and at least one type of light-emitting material, wherein the aforementioned host material is a fluorescent anthracene derivative, [the material] fluoresces blue light under DC current with a current density of 25 mA/cm$^2$, if we let λ (nm) be the shortest wavelength of [all] the wavelengths at which the intensity of PL emission of a film composed of just the aforementioned host material is one-half the maximum emission intensity, then the intensity of PL emission at the aforementioned wavelength λ of a film composed of the aforementioned light-emitting composition is no more than 1/10 the maximum emission intensity of PL emission of the film composed of the aforementioned light-emitting composition, and the PL emission of the film composed of the aforementioned light-emitting composition satisfies CIE y≤0.08.

Specifically, the present invention can be achieved by the following means: Note that in this Specification, "from . . . to . . . " indicates a range in which the two numerical values given are included as the minimum value and maximum value, respectively.

(1) An organic electroluminescent element that includes a light-emitting layer composed of a light-emitting composition containing at least one type of host material and at least one type of light-emitting material, wherein the host material is a fluorescent anthracene derivative,

[the material] fluoresces blue light under DC current with a current density of 25 mA/cm$^2$, if we let λ (nm) be the shortest wavelength of [all] the wavelengths at which the intensity of PL emission of a film composed of only the host material is one-half the maximum emission intensity, then the intensity of PL emission at the wavelength λ of a film composed of the light-emitting composition is no more than 1/10 the maximum emission intensity of PL emission of the film composed of the light-emitting composition, and the PL emission of the film composed of the light-emitting composition satisfies CIE y≤0.08.

(2) The organic electroluminescent element according to (1), wherein the reorganization energy of the light-emitting material in a transition from a first excited singlet state ($S_1$) to a ground state ($S_0$) is 0.15 eV or less.

(3) The organic electroluminescent element according to (1) or (2), wherein PL emission of a toluene solution in which the concentration of the light-emitting material is no more than 10 mg/L exhibits a maximum emission intensity of at least 426 nm and no more than 438 nm.

(4) The organic electroluminescent element according to any one of (1) to (3), wherein the intensity of PL emission at the wavelength λ of the film composed of the light-emitting composition is no more than 1/20 the maximum emission intensity of the PL emission of the film composed of the light-emitting composition.

(5) The organic electroluminescent element according to any one of (1) to (4), wherein the host material is a fluorescent anthracene derivative expressed by General Formula 1 below:

General Formula 1

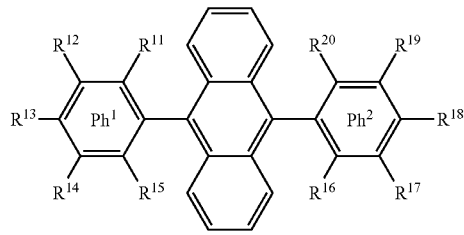

where in General Formula 1, $Ph^1$ is a phenyl group; $Ph^2$ is a phenylene group; $R^{11}$ to $R^{15}$ are each independently a hydrogen atom (including a deuterium atom), an alkyl group, or a silyl group, and $R^{11}$ to $R^{15}$ will not bond together to form a ring; one of $R^{16}$ to $R^{20}$ is an aryl group, and the others of $R^{16}$ to $R^{20}$ are each independently a hydrogen atom (including a deuterium atom) or an alkyl group, and $R^{16}$ to $R^{20}$ will not bond together to form a ring.

(6) The organic electroluminescent element according to any one of (1) to (5), wherein the light-emitting material is a material expressed by General Formula 2, 3, or 4 below:

General Formula 2

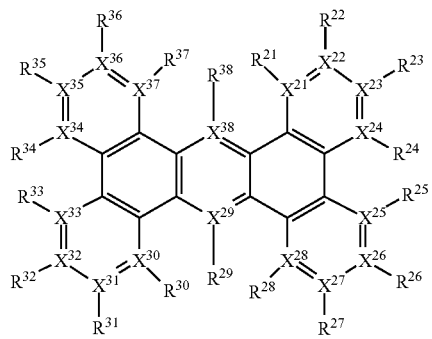

where in General Formula 2, $R^{21}$ to $R^{38}$ are each independently a hydrogen atom or a substituent, at least one of $R^{21}$ to $R^{28}$ and $R^{30}$ to $R^{37}$ is $-L^{21}-NR^{39}R^{40}$ ($R^{39}$ and $R^{40}$ are each independently an alkyl group, an aryl group, or a heteroaryl group, $R^{39}$ and $R^{40}$ may together form a ring, and $L^{21}$ is a single bond or a divalent linking group); and $X^{21}$ to $X^{38}$ are each independently a hydrogen atom or a nitrogen atom, and if $X^{21}$ to $X^{38}$ express a nitrogen atom, there is no $R^{21}$ to $R^{38}$ bonded thereto, General Formula 3

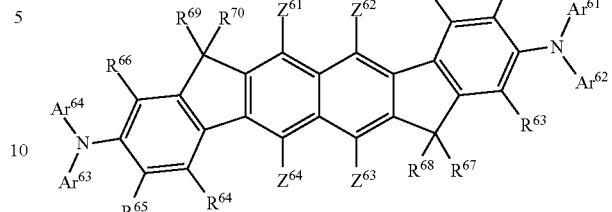

where in General Formula 3, $R^{61}$ to $R^{66}$ are each independently a hydrogen atom or a substituent, and $R^{61}$ and $R^{62}$, and $R^{64}$ and $R^{65}$ may respectively bond together to form a ring;

$R^{67}$ to $R^{70}$ are each independently an aryl group or a $C_1$ to $C_5$ alkyl group; when $R^{67}$ and $R^{68}$ are alkyl groups or substituents having an alkyl chain, the sum of the carbon numbers of the alkyl groups expressed by these groups is 2 to 8, and when $R^{69}$ and $R^{70}$ are alkyl groups or substituents having an alkyl chain, the sum of the carbon numbers of the alkyl groups expressed by these groups is 2 to 8;

$Z^{61}$ and $Z^{62}$, and $Z^{63}$ and $Z^{64}$ may respectively bond together to form a ring, but will not form an aromatic ring; if $Z^{61}$ and $Z^{62}$, and $Z^{63}$ and $Z^{64}$ respectively bond together to form a ring, then $Z^{61}$ to $Z^{64}$ are each independently an alkyl group (but $Z^{61}$ and $Z^{62}$ will not both be an alkyl group, and $Z^{63}$ and $Z^{64}$ will not both be an alkyl group), an aryl group, a heteroaryl group, a silyl group, —O—, or —NY— (where Y is an alkyl group or an aryl group); if $Z^{61}$ and $Z^{62}$, and $Z^{63}$ and $Z^{64}$ respectively do not bond together to form a ring, then $Z^{61}$ to $Z^{64}$ are each independently a hydrogen atom (including a deuterium atom), an alkyl group, an aryl group, a heteroaryl group, a fluorine atom, a silyl group, or a cyano group; $Z^{61}$ to $Z^{64}$ may further have a substituent; and $Ar^{61}$ to $Ar^{64}$ are each independently an alkyl group, an aryl group, or a heteroaryl group, and may bond together to form a ring, General Formula 4

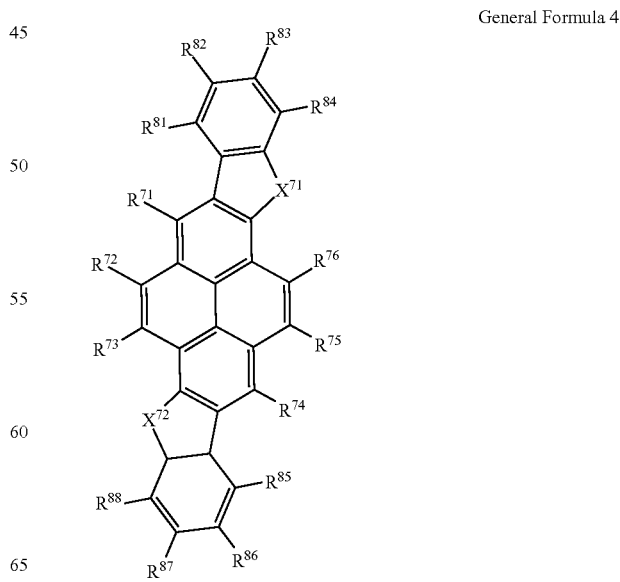

where in General Formula 4, $X^{71}$ and $X^{72}$ are the same linking group and are both an oxygen atom or a sulfur atom; $R^{71}$ to $R^{76}$ are each independently a hydrogen atom or a substituent, and a plurality of $R^{71}$ to $R^{76}$ may together form a ring; $R^{81}$ to $R^{88}$ are each independently a hydrogen atom or a substituent, but if two of $X^{71}$ and $X^{72}$ are both a sulfur atom, then at least one of $R^{72}$, $R^{73}$, $R^{75}$, and $R^{76}$ is a substituent.

(7) The organic electroluminescent element according to any one of (1) to (6), wherein the amount of the light-emitting material contained in the light-emitting composition is 0.1 to 20 wt %.

(8) An organic electroluminescent element that includes a light-emitting layer composed of a light-emitting composition containing at least one type of host material and at least one type of light-emitting material, wherein the host material is a fluorescent anthracene derivative,

[the material] fluoresces blue light under DC current with a current density of 25 mA/cm$^2$, the chromaticity of the fluorescent emission is CIE x≤0.18 and CIE y≤0.08, and the time it takes until the EL brightness of the front face decreases to 90% of the initial brightness when DC current is continuously supplied at a current density of 25 mA/cm$^2$ is at least 30 hours.

(9) The organic electroluminescent element according to any one of (1) to (8), wherein the organic electroluminescent element has a pair of electrodes, one of the pair of electrodes is an electrode with a visible light transmissivity of less than 10%, and the other is an electrode with a visible light transmissivity of at least 80%.

(10) A light-emitting device featuring the organic electroluminescent element according to any one of (1) to (9).

(11) A display device featuring the organic electroluminescent element according to any one of (1) to (9).

(12) A lighting device featuring the organic electroluminescent element according to any one of (1) to (9).

Effects of the Invention

With the present invention, it is possible to provide an organic electroluminescent element with which both good durability and high color purity of the element can be achieved, without sacrificing the other characteristics possessed by a conventional organic electroluminescent element. In particular, the present invention makes it possible to provide a blue organic electroluminescent element with which both good durability and high color purity of the element can be achieved.

DETAILED DESCRIPTION OF EMBODIMENTS

<Organic Electroluminescent Element>

Figure 1:
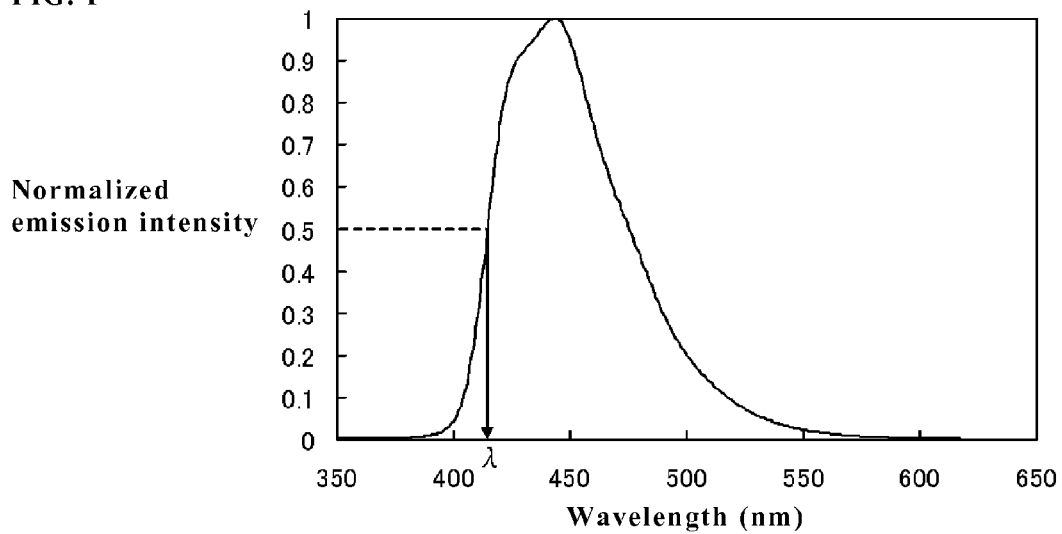
FIG. 1 is a diagram showing in model form how the wavelength λ in the present invention is found.

The organic electroluminescent element of the present invention will be described in detail.

The organic electroluminescent element of the present invention is an organic electroluminescent element that includes a light-emitting layer composed of a light-emitting composition containing at least one type of host material and at least one type of light-emitting material, with this organic electroluminescent element being such that the aforementioned host material is a fluorescent anthracene derivative, [the material] fluoresces blue light under DC current with a current density of 25 mA/cm$^2$, if we let λ(nm) be the shortest wavelength of [all] the wavelengths at which the intensity of PL emission of a film composed of only the aforementioned host material is one-half the maximum emission intensity, then the intensity of PL emission at the aforementioned wavelength λ of a film composed of the aforementioned light-emitting composition is no more than ¹⁄₁₀ the maximum emission intensity of PL emission of the film composed of the aforementioned light-emitting composition, and the PL emission of the film composed of the aforementioned light-emitting composition satisfies CIE y≤0.08.

In this Specification, the chromaticity of the organic electroluminescent element refers to the chromaticity obtained by a method in which the xy chromaticity coordinates are calculated in the International Display Method established in 1931 by the International Commission on Illumination CIE (Commission Internationale de l'Éclairage), from the emission spectrum obtained by causing this element to emit light under DC current at a current density of 25 mA/cm$^2$.

The chromaticity of the fluorescent emission when the organic electroluminescent element of the present invention fluoresces blue light under DC current with a current density of 25 mA/cm$^2$ is preferably 0.005≤CIE y≤0.08, more preferably 0.005≤CIE y≤0.07, and even more preferably 0.005≤CIE y≤0.06.

It is undesirable for the aforementioned chromaticity to be outside the range of CIE y≤0.08 because color rendering in the blue band in illumination and color reproducibility in the blue band in the display will be inadequate.

The organic electroluminescent element of the present invention includes, as a light-emitting layer, a film composed of a light-emitting composition which is such that if we let λ (nm) be the shortest wavelength of [all] the wavelengths at which the intensity of PL emission of a film composed of only the host material is one-half the maximum emission intensity, then the intensity of PL emission at the aforementioned wavelength λ of a film composed of the light-emitting composition is no more than ¹⁄₁₀ the maximum emission intensity of PL emission of the film composed of the aforementioned light-emitting composition, and the PL emission of the film composed of the aforementioned light-emitting composition satisfies CIE y≤0.08.

[The phrase] "the shortest wavelength λ (nm) of [all] the wavelengths at which the intensity of PL emission of a film composed of only the host material is one-half the maximum emission intensity" in this Specification refers to a wavelength found by the following procedure:

The host material is vapor-deposited over a quartz substrate measuring 25 mm$^2$ so as to obtain a film thickness of 50 nm. Aluminum is then vapor-deposited so as to obtain [a thickness of] 100 nm.

Without coming into contact with the air, this laminate film is placed in a glove box that has been replaced with nitrogen gas, and [this box] is sealed using a sealing canister made of glass and a UV curing adhesive agent (XNR5516HV made by Nagase Ciba), [the product of which is] used as a PL emission spectrum measurement sample (hereinafter also referred to as "sample (host material)").

Then, by using a UV-visible fiber light source (L10290 [made by] Hamamatsu Photonics) and a spectrometer (QE65000 [made by] Ocean Optics), the light from a deuterium lamp built into the light source is taken off, passed through a UV transmission filter (S76-UG5 [made by] Suruga Seiki), and directed as excitation light at the aforementioned sample (host material) from the substrate side, and the PL emission spectrum is measured. The shortest wavelength out of the wavelengths at which the intensity is one-half the maximum emission intensity is found as $\lambda$ from the resulting PL emission spectrum.

For instance, in an example of the PL emission spectrum of the host material, the aforementioned wavelength $\lambda$ can be found as the wavelength shown in FIG. 1.

Note that in the measurement of the PL emission of a film composed of only the aforementioned host material, the reason for employing the shortest wavelength $\lambda$ (nm) out of the wavelengths at which the intensity is one-half the maximum emission intensity is that in emission from the light-emitting layer, emission at the wavelength $\lambda$ will include almost no light originating from the light-emitting material, and the amount of light emission of the host material will appear clearly, so the extent of emission by the host material can be ascertained by utilizing the emission at the wavelength $\lambda$.

Furthermore, if the light-emitting layer of the organic electroluminescent element contains n types of host material (n≥2), n number of $\lambda$ ($\lambda_1, \ldots, \lambda_n$) will be obtained for each host. In this case, the intensity of PL emission at the wavelength $\lambda$ (described later) expresses the intensity of PL emission at the shortest wavelength $\lambda$ out of the aforementioned n number of $\lambda$. This is because the host material with the smallest $\lambda$ out of the aforementioned n number of host materials will have the highest energy in an excited state and readily decompose, and the effect on the durability of the organic electroluminescent element will be the greatest.

Moreover, in this Specification, the ratio of the intensity of PL emission at the aforementioned wavelength $\lambda$ of a film composed of a light-emitting composition containing at least one type of host material and at least one type of light-emitting material (hereinafter also referred to simply as "film composed of a light-emitting composition"), to the maximum emission intensity of PL emission of the film composed of the aforementioned light-emitting composition refers to a ratio found by the following procedure:

A film composed of the aforementioned light-emitting composition is produced by vapor deposition on a quartz substrate measuring 25 mm$^2$ such that the film thickness will be 50 nm. Aluminum is then vapor-deposited so as to obtain [a thickness of] 100 nm.

Without coming into contact with the air, this film composed of the light-emitting composition is placed inside a glove box that has been replaced with nitrogen gas, and [this box] is sealed using a sealing canister made of glass and a UV curing adhesive agent (XNR5516HV made by Nagase Ciba), [the product of which] is used as a PL emission spectrum measurement sample.

Then, by using a UV-visible fiber light source (L10290 [made by] Hamamatsu Photonics) and a spectrometer (QE65000 [made by] Ocean Optics), the light from a deuterium lamp built into the light source is taken off, passed through a UV transmission filter (S76-UG5 [made by] Suruga Seiki), and directed as excitation light at the film composed of the aforementioned light-emitting composition from the substrate side, and the PL emission spectrum is measured. The ratio of the intensity of PL emission at the aforementioned wavelength $\lambda$ of the film composed of the aforementioned light-emitting composition, to the maximum emission intensity of PL emission of the film composed of the aforementioned light-emitting composition (hereinafter also referred to as "host emission intensity ratio") is found from the resulting spectrum.

Figure 2:
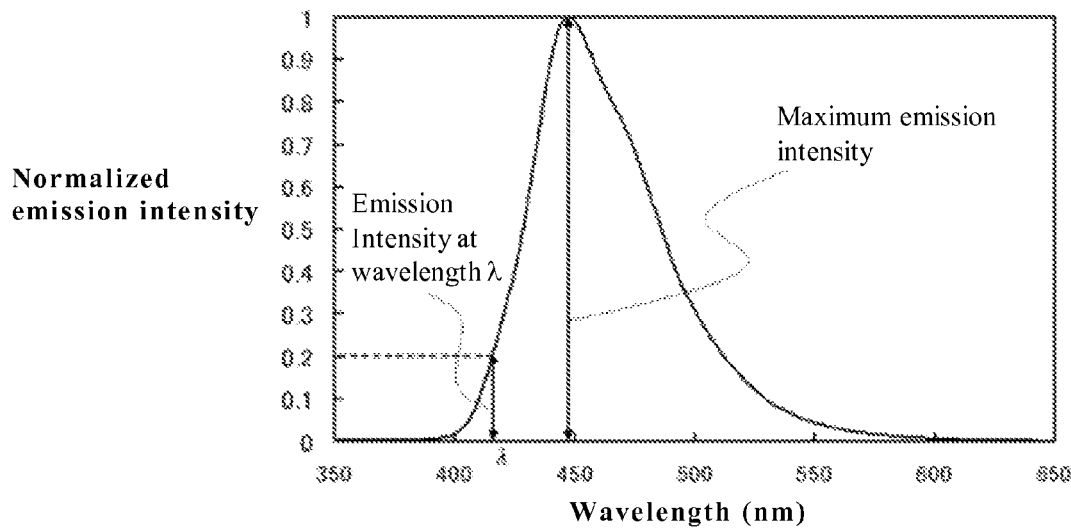
FIG. 2 is a diagram showing in model form how the host emission intensity ratio in the present invention is found.

For instance, in an example of the PL emission spectrum of the film composed of the aforementioned light-emitting composition, the maximum emission intensity and the intensity of PL emission at the aforementioned wavelength $\lambda$ are found as the intensity shown in FIG. 2.

With the organic electroluminescent element of the present invention, the intensity of PL emission at the aforementioned wavelength $\lambda$ of the film composed of the aforementioned light-emitting composition is no more than $1/10$ the maximum emission intensity of PL emission of the film composed of the aforementioned light-emitting composition.

Here, the intensity of PL emission at the aforementioned wavelength $\lambda$ corresponds to the intensity of PL emission of the host material included in the film composed of the aforementioned light-emitting composition. The PL emission of the host material in a film composed of the aforementioned light-emitting composition combines with the PL emission of the light-emitting material, which has the effect of enhancing the color purity of the emission of the film. It is preferable if the intensity of PL emission of the host material included in the film composed of the aforementioned light-emitting composition is kept within the aforementioned range because decomposition of the host material can be suppressed, and the durability of the organic electroluminescent element is increased.

The relationship between the color purity and the durability of the element, and the intensity of PL emission of the host material included in the film composed of the aforementioned light-emitting composition also applies to the color purity and the durability of the element when this film is used as a light-emitting layer in an organic EL element.

The intensity of PL emission at the aforementioned wavelength $\lambda$ of the film composed of the aforementioned light-emitting composition is preferably at least 0 and no more than $1/10$, more preferably at least $1/120$ and no more than $1/10$, and even more preferably at least $1/120$ and no more than $1/20$, with respect to the maximum emission intensity of PL emission of the film composed of the aforementioned light-emitting composition.

In addition, the "CIE y" of PL emission of the film composed of the aforementioned light-emitting composition refers to a value found by the following procedure:

By using a UV-visible fiber light source (L10290 [made by] Hamamatsu Photonics) and a spectrometer (QE65000 [made by] Ocean Optics), the light from a deuterium lamp built into the light source is taken off and passed through a UV transmission filter (S76-UG5 [made by] Suruga Seiki), the film composed of the aforementioned light-emitting composition is irradiated with the excitation light from the substrate side, and the PL emission spectrum is measured. From the resulting spectrum, the CIE y value is calculated by a method in which the y coordinate of the xy chromaticity coordinates is calculated in the International Display Method established in 1931 by the International Commission on Illumination CIE.

With the organic electroluminescent element of the present invention, the PL emission of the film composed of the aforementioned light-emitting composition satisfies CIE y≤0.08. From the standpoints of color rendering in illumination and color reproducibility in display, it is preferable for the PL emission of the film composed of the aforementioned light-emitting composition to satisfy 0.005≤CIE y≤0.08, more preferable to satisfy 0.005≤CIE y≤0.07, and even more preferable to satisfy 0.005≤CIE y≤0.06.

With the organic electroluminescent element of the present invention, it is preferable if the organic electroluminescent element has on a substrate a pair of electrodes and at least one organic layer that includes a light-emitting layer between these electrodes.

Besides the light-emitting layer, the organic layers may include a hole injection layer, a hole transport layer, a blocking layer (a hole blocking layer, an exciton blocking layer, etc.), an electron transport layer, or the like. These organic layers may each be provided as a plurality of layers, and if a plurality of layers are provided, they may be formed from the same material, or each layer may be formed from a different material.

Figure 3:
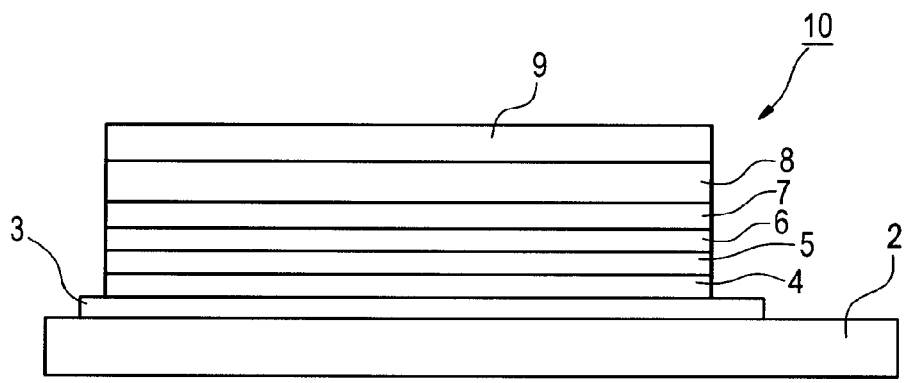
FIG. 3 is a schematic diagram showing one example of the configuration of the organic electroluminescent element according to the present invention.

FIG. 3 shows one example of the configuration of the organic electroluminescent element according to the present invention. The organic electroluminescent element 10 in FIG. 3 has on a substrate 2 an organic layer that includes a light-emitting layer 6 between a pair of electrodes (an anode 3 and a cathode 9). As organic layers, a hole injection layer 4, a hole transport layer 5, the light-emitting layer 6, a hole blocking layer 7, and an electron transport layer 8 are laminated in this order, starting from the side of the anode 3.

<Configuration of Organic Layers>

There are no particular restrictions on the layer configuration of the organic layers, which can be suitably selected as dictated by the purpose and application of the organic electroluminescent element, but they are preferably formed over the aforementioned transparent electrodes or over the aforementioned semi-transparent electrodes. In this case, the organic layers are formed on the surface or one face of the aforementioned transparent electrodes or the aforementioned semi-transparent electrodes.

There are no particular restrictions on the shape, size, thickness, and so forth of the organic layers, which can be suitably selected as dictated by the intended purpose.

The following are concrete examples of the layer configuration, but the present invention is not limited to or by these configurations:

anode/hole transport layer/light-emitting layer/electron transport layer/cathode
anode/hole transport layer/light-emitting layer/blocking layer/electron transport layer/cathode
anode/hole transport layer/light-emitting layer/blocking layer/electron transport layer/electron injection layer/cathode
anode/hole injection layer/hole transport layer/light-emitting layer/blocking layer/electron transport layer/cathode
anode/hole injection layer/hole transport layer/light-emitting layer/electron transport layer/electron injection layer/cathode
anode/hole injection layer/hole transport layer/light-emitting layer/blocking layer/electron transport layer/electron injection layer/cathode The element configuration, substrate, cathode, and anode of the organic electroluminescent element are described in detail in Japanese Laid-Open Patent Application 2008-270736, for example, and what is described in this publication can be applied to the present invention.

<Organic Layers>

The organic layers of the present invention will now be described.

(Formation of Organic Layers)

In the organic electroluminescent element of the present invention, each of the organic layers can be favorably formed by vapor deposition, sputtering, or another such dry film formation method, or by transfer, printing, spin coating, bar coating, or another such solution coating method.

(Light-Emitting Layer)

When an electric field is applied, the light-emitting layer accepts holes from the anode, the hole injection layer, or the hole transport layer, accepts electrons from the cathode, the electron injection layer, or the electron transport layer, and has the function of emitting light by providing a site for the rebinding of holes and electrons. The organic electroluminescent element of the present invention includes as a light-emitting layer a film that contains at least one type of host material and at least one type of light-emitting material.

—Host Material—

With the organic electroluminescent element of the present invention, the host material is a fluorescent anthracene derivative.

The aforementioned host material is preferably a fluorescent anthracene derivative expressed by General Formula 1 below:

General Formula 1

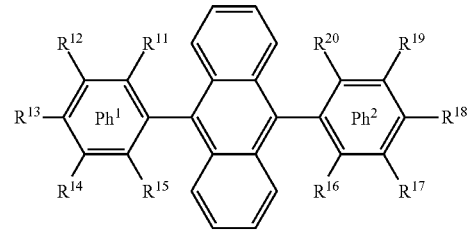

In General Formula 1, $Ph^1$ is a phenyl group; $Ph^2$ is a phenylene group; $R^{11}$ to $R^{15}$ are each independently a hydrogen atom (including a deuterium atom), an alkyl group, or a silyl group, and $R^{11}$ to $R^{15}$ will not bond together to form a ring; one of $R^{16}$ to $R^{20}$ is an aryl group, and the others of $R^{16}$ to $R^{20}$ are each independently a hydrogen atom (including a deuterium atom) or an alkyl group, and $R^{16}$ to $R^{20}$ will not bond together to form a ring.

The aforementioned $R^{11}$ to $R^{15}$ are all preferably a hydrogen atom (including a deuterium atom).

One of the aforementioned $R^{16}$ to $R^{20}$ is preferably a $C_6$ to $C_{20}$ aryl group, more preferably a phenyl group or naphthyl group, and even more preferably a naphthyl group. Furthermore, the others of $R^{16}$ to $R^{20}$ are all preferably a hydrogen atom (including a deuterium atom).

Concrete, preferred examples of the fluorescent anthracene derivative expressed by General Formula 1 are given below, but [the fluorescent anthracene derivative] is not limited to the following:

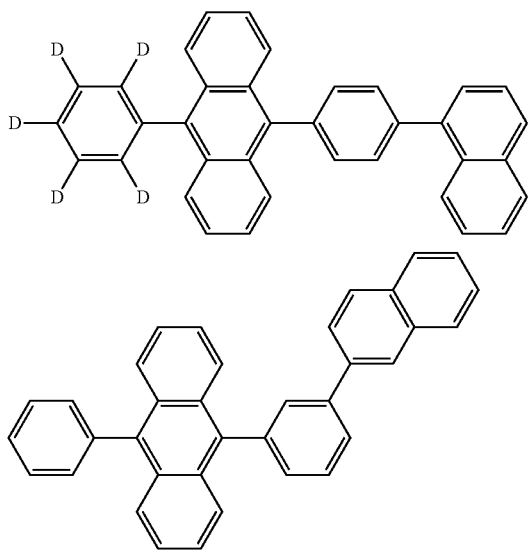

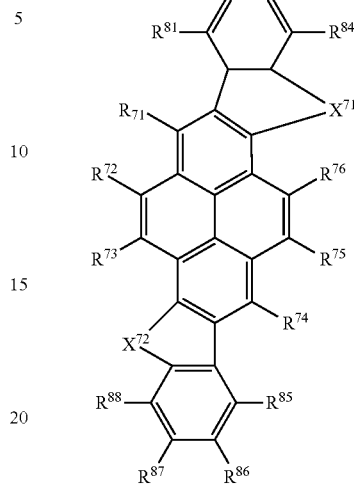

—Light-Emitting Material—

There are no particular restrictions on the light-emitting material in the organic electroluminescent element of the present invention so long as when it is used along with the aforementioned host material, it gives an organic electroluminescent element that fluoresces blue light under DC current with a current density of 25 mA/cm$^2$, and the chromaticity of this fluorescent light is CIE x≤0.18 and CIE y≤0.08.

The material expressed by General Formula 2, 3, or 4 below is favorable as the aforementioned light-emitting material.

General Formula 2

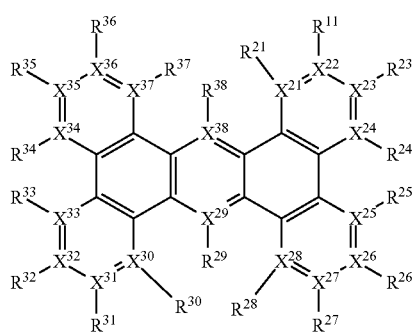

General Formula 3

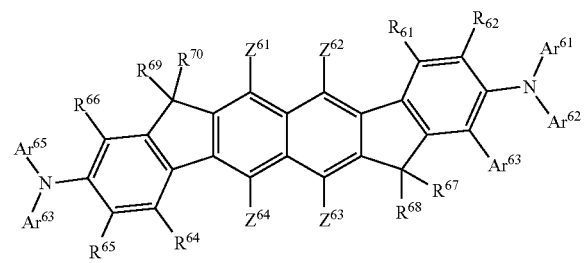

General Formula 4

In General Formula 2, $R^{21}$ to $R^{38}$ are each independently a hydrogen atom or a substituent; at least one of $R^{21}$ to $R^{28}$ and $R^{30}$ to $R^{37}$ is -$L^{21}$-$NR^{39}R^{40}$ ($R^{39}$ and $R^{40}$ are each independently an alkyl group, an aryl group, or a heteroaryl group, $R^{39}$ and $R^{40}$ may together form a ring, and $L^{21}$ is a single bond or a divalent linking group); and $X^{21}$ to $X^{38}$ are each independently a hydrogen atom or a nitrogen atom, and if $X^{21}$ to $X^{38}$ express a nitrogen atom, there is no $R^{21}$ to $R^{38}$ bonded thereto.

A single bond, an alkylene group, or an arylene group is preferable as the divalent linking group expressed by $L^{21}$, with a single bond, a methylene group, an ethylene group, and a phenylene group being [more] preferable. It is particularly preferable for $L^{21}$ to be a single bond.

$R^{39}$ and $R^{40}$ may together form a ring.

Moreover, in cases where a plurality of $R^{21}$ to $R^{38}$ together form a ring, in concrete terms, either $R^{39}$ or $R^{40}$ may form a ring together with any of $R^{21}$ to $R^{38}$ other than the -$L^{21}$-$NR^{39}R^{40}$ in which this $R^{39}$ or $R^{40}$ is included.

The alkyl group expressed by $R^{39}$ or $R^{40}$ is preferably a $C_1$ to $C_{30}$ alkyl group, more preferably a $C_1$ to $C_{20}$ alkyl group, and particularly preferably a $C_1$ to $C_{10}$ alkyl group, [namely,] a methyl group, ethyl group, n-propyl group, isopropyl group, tert-butyl group, n-octyl group, n-decyl group, n-hexadecyl group, cyclopropyl group, cyclopentyl group, or cyclohexyl group, with a methyl group, ethyl group, or n-propyl group being particularly favorable.

The alkyl group expressed by $R^{39}$ or $R^{40}$ may further have a substituent. This substituent is preferably an aryl group, with a phenyl group being more preferable.

If $R^{39}$ and $R^{40}$ express an alkyl group, then it is also preferable for $R^{39}$ and $R^{40}$ to form a ring together, in which case the ring that is formed is preferably a five- or six-member ring, more preferably a six-member ring, and particularly preferably a piperidine ring.

In addition, if $R^{39}$ or $R^{40}$ expresses an alkyl group, then it is also preferable for $R^{39}$ or $R^{40}$ to form a ring together with any of $R^{21}$ to $R^{38}$ other than the -$L^{21}$-$NR^{39}R^{40}$ in which this $R^{39}$ or $R^{40}$ is included (preferably one of $R^{21}$ to $R^{38}$ adjacent to the $R^{21}$ to $R^{38}$ expressed by the —$NR^{39}R^{40}$ in which this $R^{39}$ or $R^{40}$ is included), and the ring formed in this case is preferably a saturated five- or six-member ring, and more preferably a saturated six-member ring.

The aryl group expressed by $R^{39}$ or $R^{40}$ is preferably a $C_6$ to $C_{30}$ aryl group, more preferably a $C_6$ to $C_{20}$ aryl group (such as a phenyl group, a naphthyl group, an anthranyl group, a phenanthrenyl group, or a triphenylenyl group), and particularly preferably a $C_6$ to $C_{15}$ aryl group, with a phenyl group, a 1-naphthyl group, and a 2-naphthyl group being particularly favorable, and phenyl group and a 2-naphthyl group being even more particularly favorable.

The aryl group expressed by $R^{39}$ or $R^{40}$ may further have a substituent. This substituent is preferably an alkyl group (preferably a $C_1$ to $C_5$ alkyl group, more preferably a methyl group, an ethyl group, an n-propyl group, an isopropyl group, or a tert-butyl group, and particularly preferably a methyl group), an aryl group (preferably a $C_6$ to $C_{10}$ aryl group, and more preferably a phenyl group; this aryl group may further have a substituent, in which case the substituent is preferably in the para position), a halogen atom (preferably a fluorine atom), or a silyl group (preferably a trimethylsilyl group or a triphenylsilyl group), and more preferably an alkyl group or an aryl group.

Furthermore, if there are a plurality of substituents of the aryl group expressed by $R^{39}$ or $R^{40}$, these substituent may bond together to form a ring, and the ring formed in this case is preferably a five- or six-member ring, and more preferably a five-member ring. The five- or six-member ring thus formed is preferably either a hydrocarbon ring or a hetero ring, and more preferably a five-member hetero ring or a five-member hydrocarbon ring.

The compounds expressed by General Formula 2 above are preferably expressed by General Formula 2-2 below:

same as the description and preferred ranges of $R^{21}$, $R^{22}$, $R^{24}$ to $R^{31}$, and $R^{33}$ to $R^{38}$ in General Formula 2 above.

The preferred ranges of the substituents expressed by $R^{41}$ to $R^{50}$ and $R^{51}$ to $R^{60}$ in General Formula 2-2 above are the same as the preferred ranges of the substituents of the aryl group when $R^{39}$ or $R^{40}$ in General Formula 2 above is an aryl group.

[The statement] "a plurality of $R^{41}$ to $R^{50}$ and $R^{51}$ to $R^{60}$ may together form a ring" about General Formula 2-2 above means that the compounds expressed by General Formula 2-2 above also include a compound in which $R^{41}$ to $R^{45}$ bond together to form an aromatic ring and, as a result, form a polycyclic condensed aromatic group, a compound in which $R^{46}$ to $R^{50}$ bond together to form an aromatic ring and, as a result, form a polycyclic condensed aromatic group, a compound in which $R^{51}$ to $R^{55}$ bond together to form an aromatic ring and, as a result, form a polycyclic condensed aromatic group, and a compound in which $R^{56}$ to $R^{60}$ bond together to form an aromatic ring and, as a result, form a polycyclic condensed aromatic group. For example, the compounds expressed by General Formula 2-2 above also include a compound in which $R^{41}$ and $R^{42}$ bond together, and as a result, a phenyl group having $R^{41}$ to $R^{45}$ forms a naphthyl group.

In General Formula 2-2 above, $X^{21}$, $X^{22}$, $X^{24}$ to $X^{31}$, and $X^{33}$ to $X^{38}$ are each independently a hydrogen atom or a nitrogen atom, and if $X^{21}$, $X^{22}$, $X^{24}$ to $X^{31}$, and $X^{33}$ to $X^{38}$ are a nitrogen atom, there is no $R^{21}$, $R^{22}$, $R^{24}$ to $R^{31}$, and $R^{33}$ to $R^{38}$ bonded thereto.

General Formula 2-2

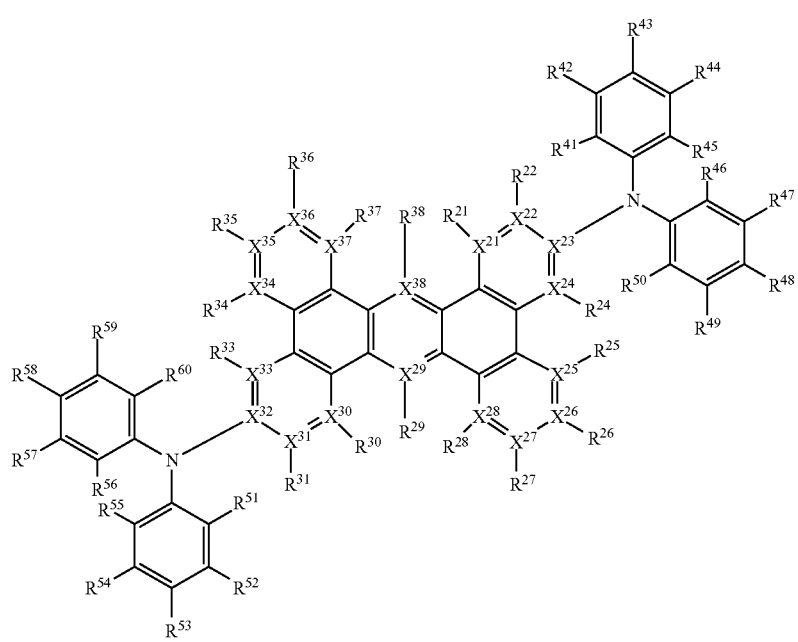

In General Formula 2-2, $R^{21}$, $R^{22}$, $R^{24}$ to $R^{31}$, $R^{33}$ to $R^{38}$, and $R^{41}$ to $R^{60}$ are each independently a hydrogen atom or a substituent. A plurality of $R^{41}$ to $R^{50}$ and $R^{51}$ to $R^{60}$ may together form a ring.

The description and preferred ranges of $R^{21}$, $R^{22}$, $R^{24}$ to $R^{31}$, and $R^{33}$ to $R^{38}$ in General Formula 2-2 above are the In General Formula 2-2 above, $X^{23}$ and $X^{32}$ are carbon atoms.

Concrete examples of the compounds expressed by General Formula 2 above are given below, but these concrete examples should not be construed as being limiting in nature:

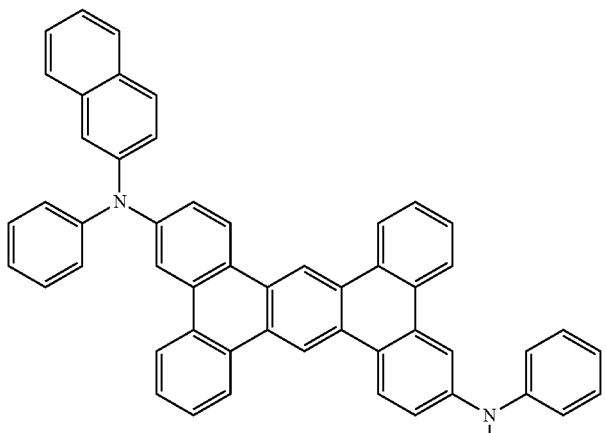
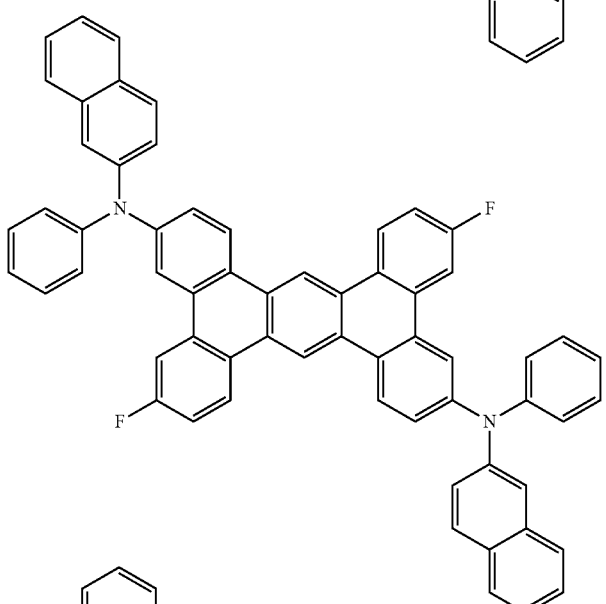
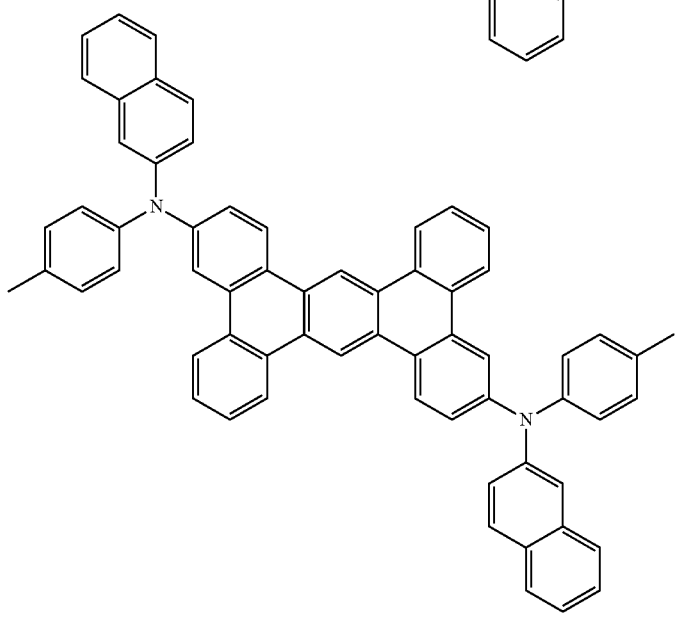

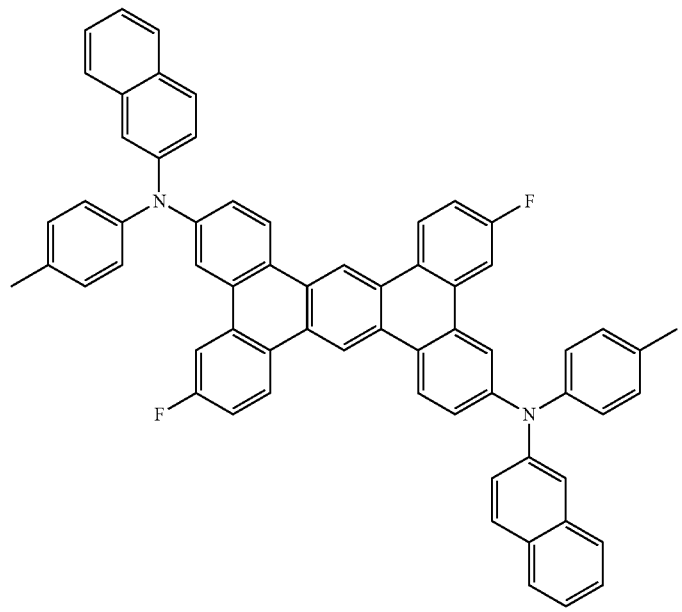
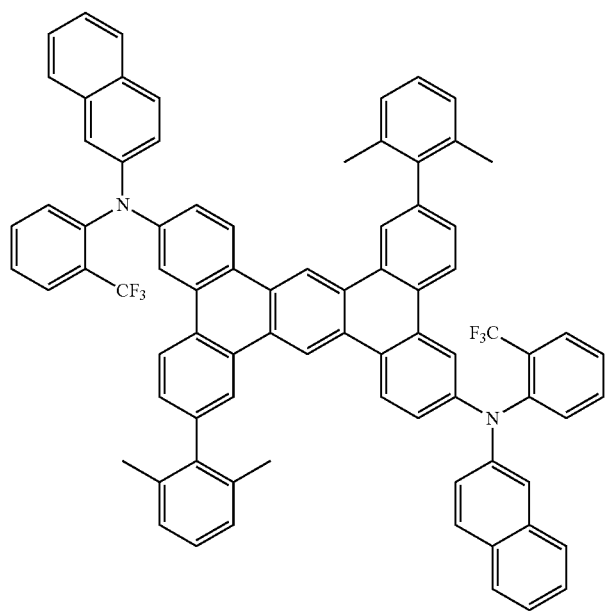

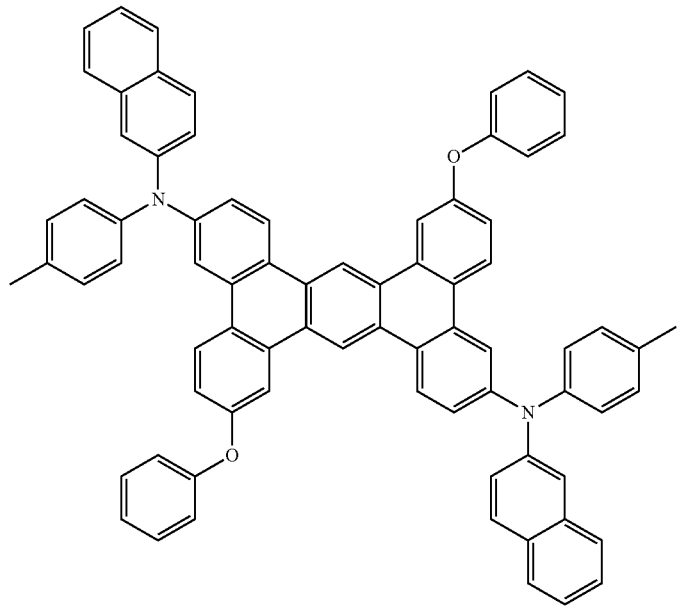
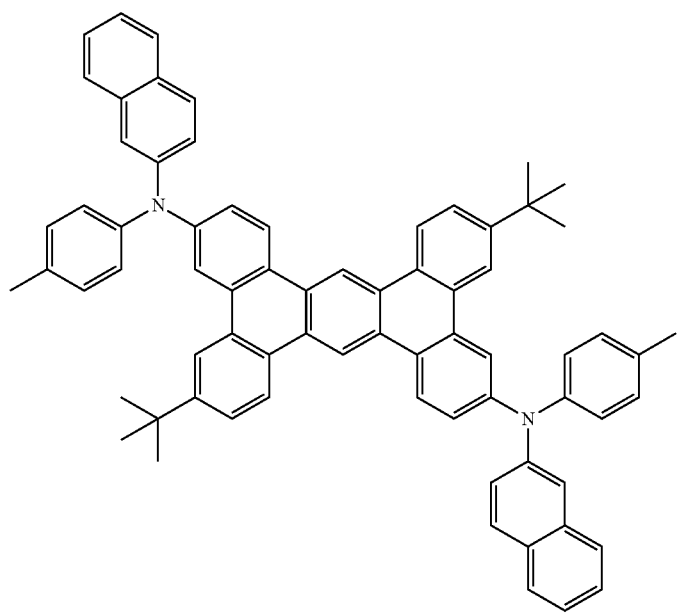

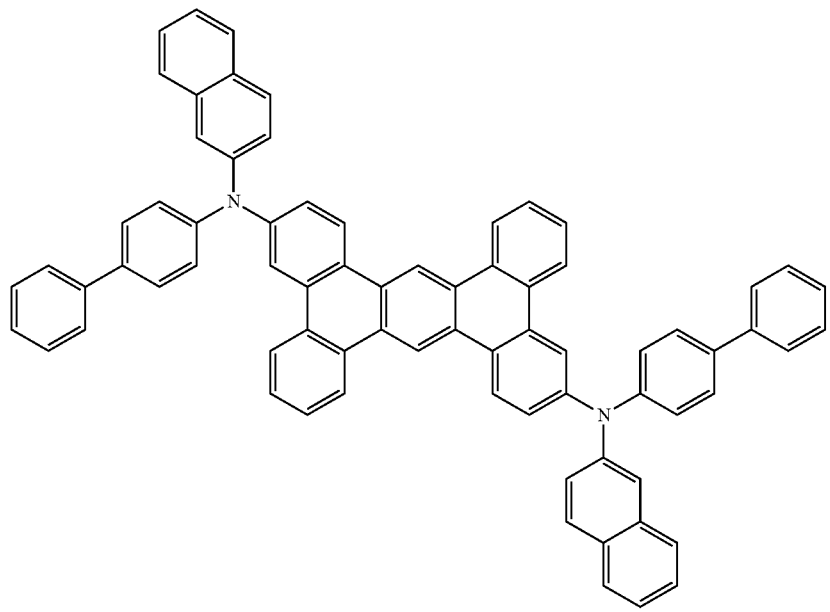
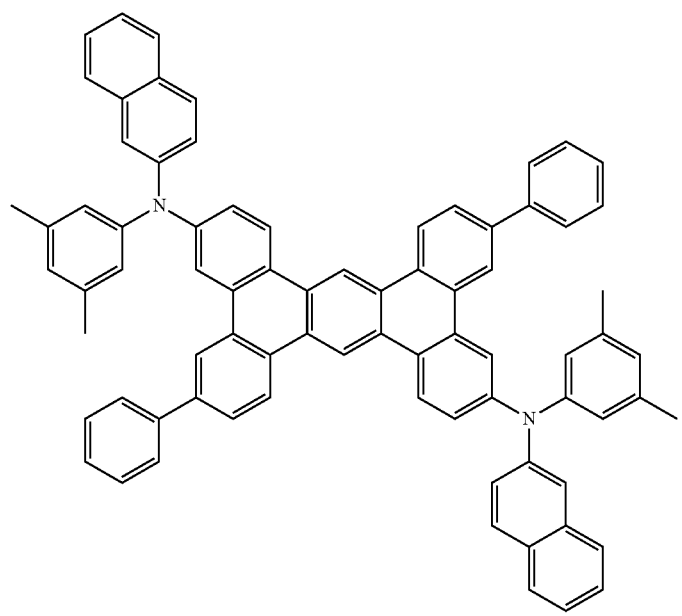

-continued
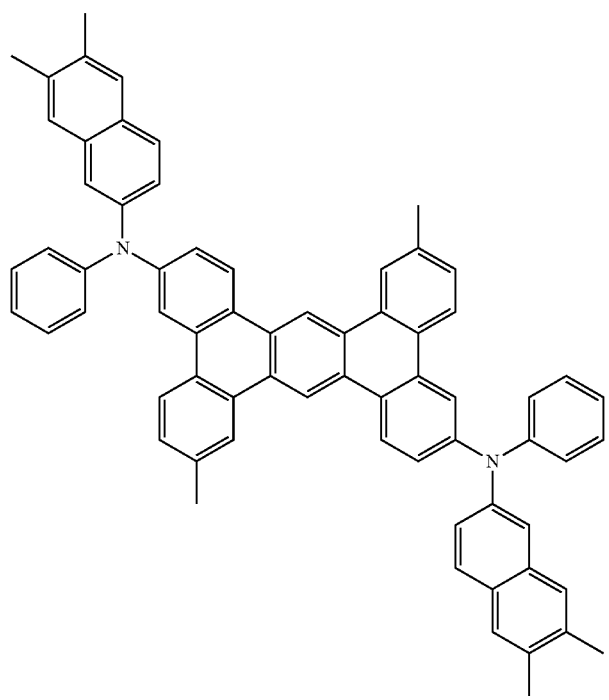
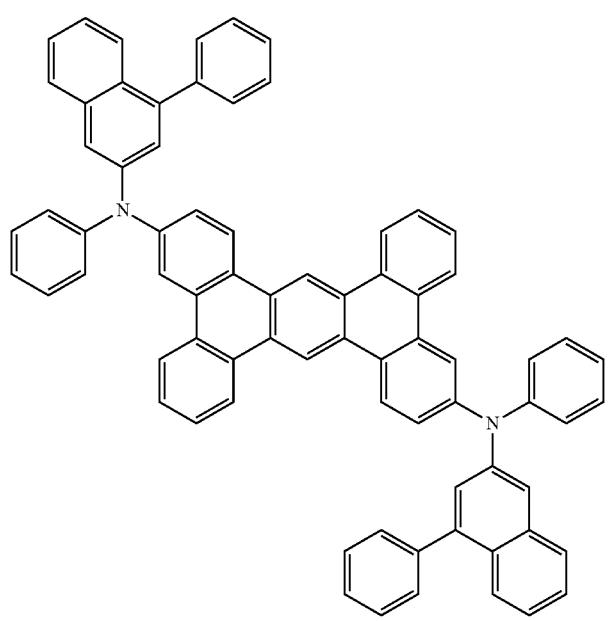

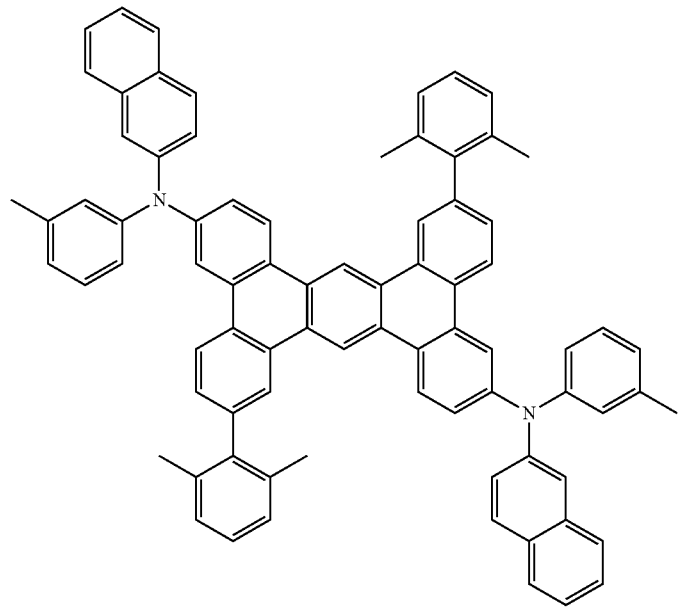
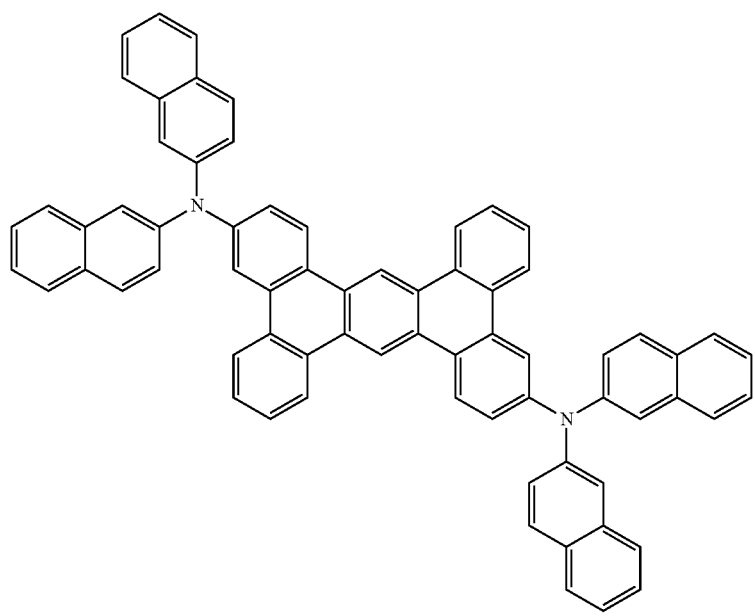

-continued
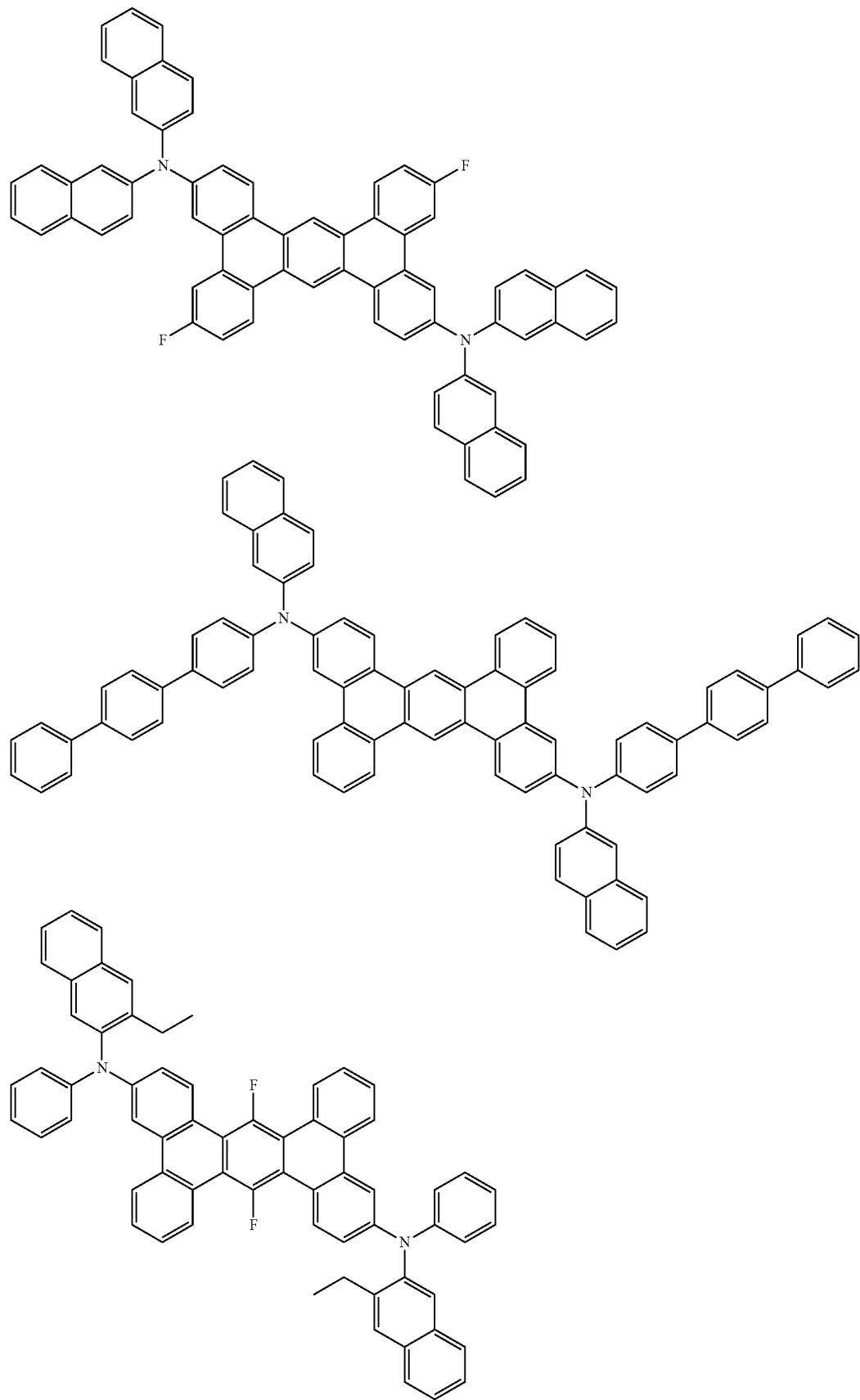

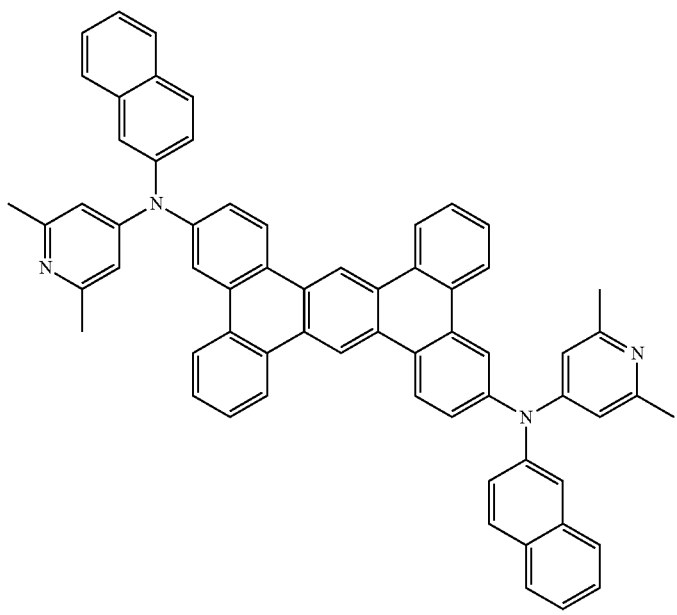
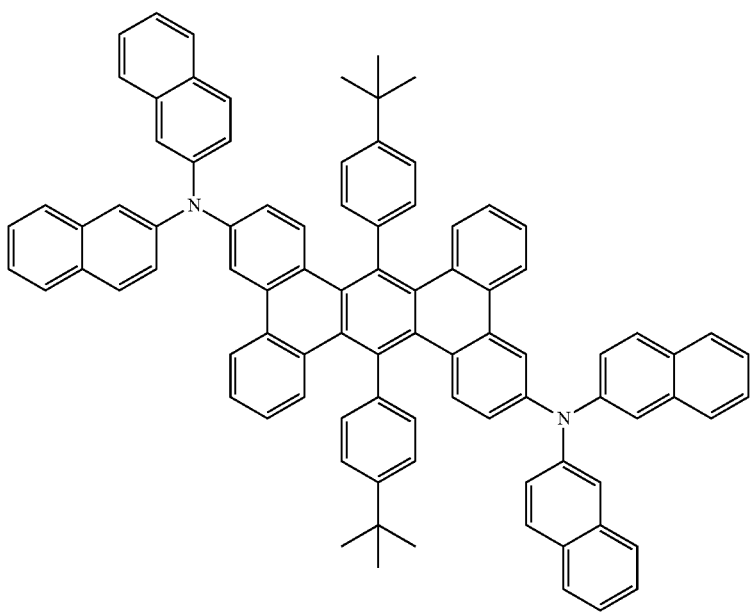
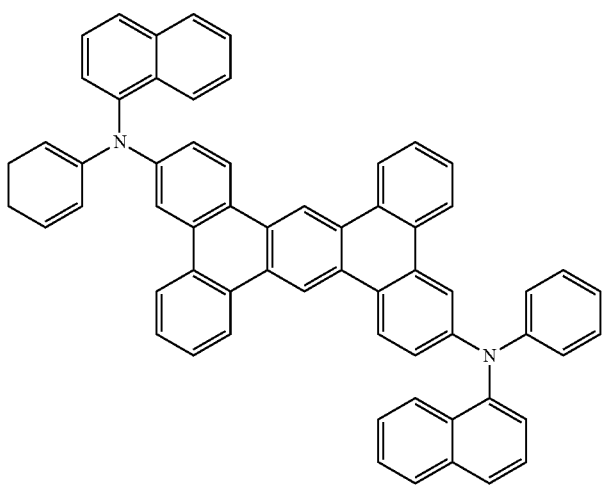

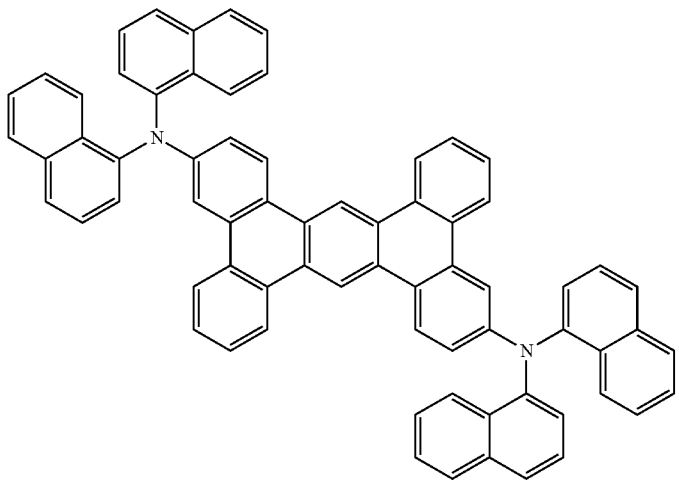

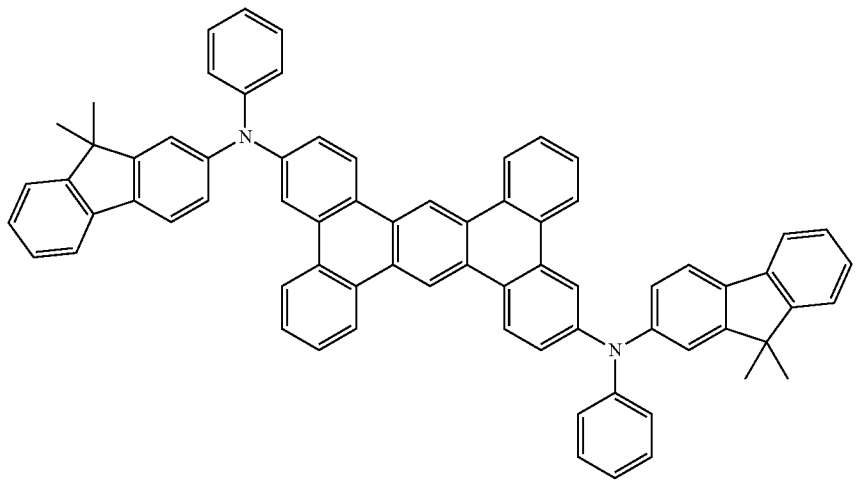

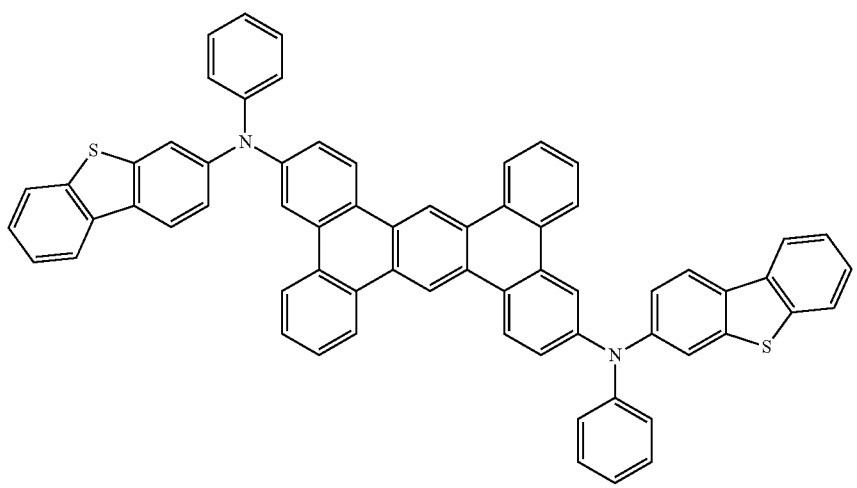 [SMILES: c1ccc(N(c2ccc3c(c2)sc2ccccc23)c2ccc3c(c2)c2ccccc2c2cc4c5ccc(N(c6ccccc6)c6ccc7c(c6)sc6ccccc67)cc5c5ccccc5c4cc32)cc1]

In General Formula 3 above, $R^{61}$ to $R^{66}$ are each independently a hydrogen atom or a substituent. $R^{61}$ and $R^{62}$, and $R^{64}$ and $R^{65}$ may respectively bond together to form a ring.

$R^{67}$ to $R^{70}$ are each independently an aryl group or a $C_1$ to $C_5$ alkyl group. When $R^{67}$ and $R^{68}$ are alkyl groups or substituents having an alkyl chain, the sum of the carbon numbers of the alkyl groups expressed by these groups is 2 to 8. When $R^{69}$ and $R^{70}$ are alkyl groups or substituents having an alkyl chain, the sum of the carbon numbers of the alkyl groups expressed by these groups is 2 to 8.

$Z^{61}$ and $Z^{62}$, and $Z^{63}$ and $Z^{64}$ may respectively bond together to form a ring, but will not form an aromatic ring.

If $Z^{61}$ and $Z^{62}$, and $Z^{63}$ and $Z^{64}$ respectively bond together to form a ring, then $Z^{61}$ to $Z^{64}$ are each independently an alkyl group (but $Z^{61}$ and $Z^{62}$ will not both be an alkyl group, and $Z^{63}$ and $Z^{64}$ will not both be an alkyl group), an aryl group, a heteroaryl group, a silyl group, —O—, or —NY— (where Y is an alkyl group or an aryl group). If $Z^{61}$ and $Z^{62}$, and $Z^{63}$ and $Z^{64}$ do not respectively bond together to form a ring, then $Z^{61}$ to $Z^{64}$ are each independently a hydrogen atom (including a deuterium atom), an alkyl group, an aryl group, a heteroaryl group, a fluorine atom, a silyl group, or a cyano group. $Z^{61}$ to $Z^{64}$ may further have a substituent.

$Ar^{61}$ to $Ar^{64}$ are each independently an alkyl group, an aryl group, or a heteroaryl group, and may bond together to form a ring.

Examples of the substituents expressed by $R^{61}$ to $R^{66}$ in General Formula 3 above include an alkyl group, an aryl group, a silyl group, a fluorine atom, an alkoxy group, and an aryloxy group, with an alkyl group being preferable, a $C_1$ to $C_3$ alkyl group being particularly preferable, and a methyl group being even more particularly preferable.

$R^{61}$ and $R^{62}$, and $R^{64}$ and $R^{65}$ may bond together to form a ring, but it is preferable if $R^{61}$ and $R^{62}$, and $R^{64}$ and $R^{65}$ do not respectively bond together to form a ring In General Formula 3 above, $Ar^{61}$ to $Ar^{64}$ are preferably each independently an aryl group or a heteroaryl group, more preferably an aryl group, and particularly preferably a $C_6$ to $C_{10}$ aryl group, with a phenyl group or a 2-naphthyl group being even more particularly preferable.

$Ar^{61}$ to $Ar^{64}$ may have an extra substituent, and the extra substituent is preferably an alkyl group, an aryl group, or a fluorine atom, more preferably a $C_1$ to $C_5$ alkyl group, a phenyl group, or a fluorine atom, and particularly preferably a methyl group. The number of extra substituents when $Ar^{61}$ to $Ar^{64}$ have an extra substituent is preferably 1 to 3, more preferably 1 or 2, and particularly preferably 1, per each of $Ar^{61}$ to $Ar^{64}$.

In General Formula 3 above, $R^{67}$ and $R^{68}$ are each independently an aryl group or a $C_1$ to $C_5$ alkyl group. The aryl group expressed by $R^{67}$ and $R^{68}$ is preferably a $C_6$ to $C_{10}$ aryl group, more preferably a $C_6$ to $C_{10}$ aryl group having an alkyl group as a substituent, and particularly preferably a phenyl group having an alkyl group as a substituent. $R^{67}$ and $R^{68}$ are preferably each independently a $C_1$ to $C_5$ alkyl group, more preferably a $C_1$ to $C_5$ alkyl group, and particularly preferably a $C_1$ to $C_3$ alkyl group.

When $R^{67}$ and $R^{68}$ are alkyl groups or substituents having an alkyl chain, the sum of the carbon numbers of the alkyl groups expressed by these groups is 2 to 8, preferably 2 to 6, and more preferably 2 to 4.

In General Formula 3, $R^{69}$ to $R^{70}$ are each independently an aryl group or a $C_1$ to $C_5$ alkyl group. The preferred ranges and preferred relations of $R^{69}$ to $R^{70}$ are the same as the preferred ranges and preferred relations of $R^{67}$ to $R^{68}$.

In General Formula 3, $Z^{61}$ and $Z^{62}$ may bond together to form a ring, but will not form an aromatic ring.

Meanwhile, if $Z^{61}$ and $Z^{62}$ do not bond together to form a ring, then $Z^{61}$ and $Z^{62}$ are each independently a hydrogen atom (including a deuterium atom), an alkyl group, an aryl group, a heteroaryl group, a fluorine atom, a silyl group, or a cyano group, preferably a hydrogen atom (including a deuterium atom), an aryl group, a fluorine atom, or a silyl group, and more preferably a hydrogen atom (including a deuterium atom) or an aryl group. Even if $Z^{61}$ and $Z^{62}$ do not bond together to form a ring, from the standpoint of shortening the emission wavelength of the organic electroluminescent element in which the compound expressed by General Formula 3 is used, it is preferable if at least one of $Z^{61}$ and $Z^{62}$ is an aryl group or a heteroaryl group, more preferably an aryl group, and particularly preferably a $C_6$ to $C_{10}$ aryl group, with a phenyl group being even more particularly preferable. If $Z^{61}$ and $Z^{62}$ do not bond together to form a ring, then $Z^{61}$ and $Z^{62}$ may further have a substituent, and a substituent on an aryl group is preferably a $C_1$ to $C_5$ alkyl group, a fluorine atom, or a cyano group, and more preferably a fluorine atom.

In General Formula 3, $Z^{63}$ and $Z^{64}$ may bond together to form a ring, but will not form an aromatic ring. The preferred ranges and preferred relations of $R^{63}$ and $R^{64}$ in General Formula 3 are the same as the preferred ranges and preferred relations of $Z^{61}$ and $Z^{62}$.

Concrete examples of the compounds expressed by General Formula 3 above are given below, but the compounds expressed by General Formula 3 that can be used in the present invention should not be construed as being limited to or by these concrete examples:

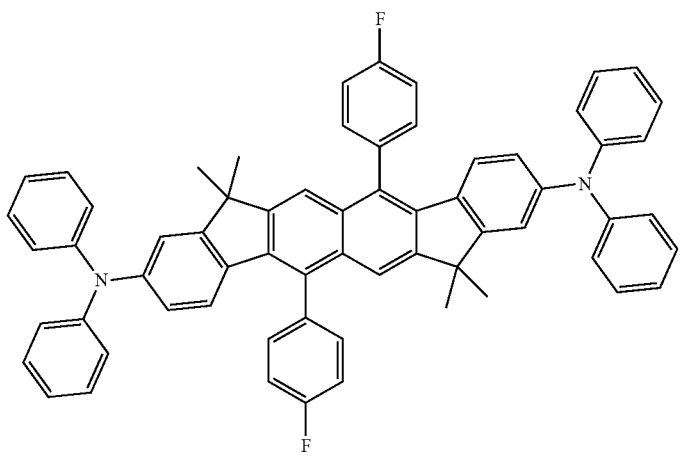

-continued
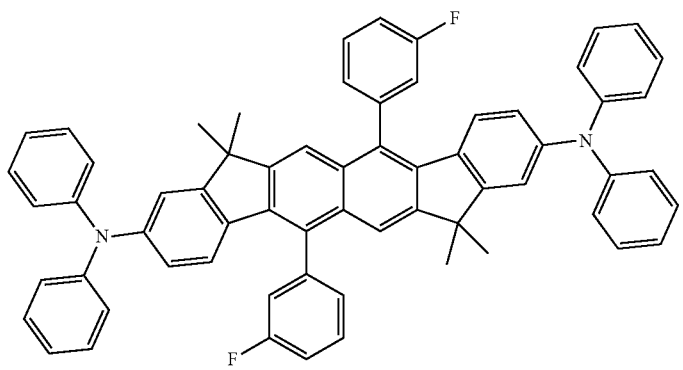
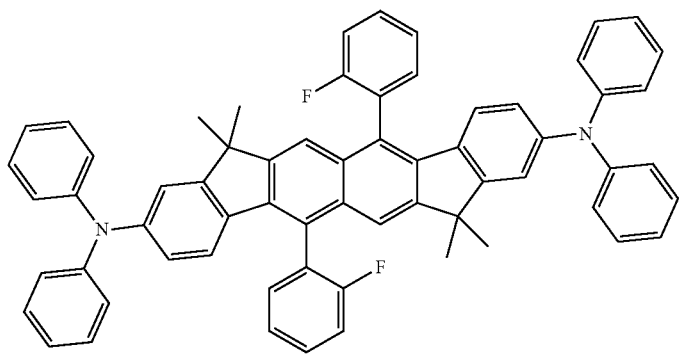
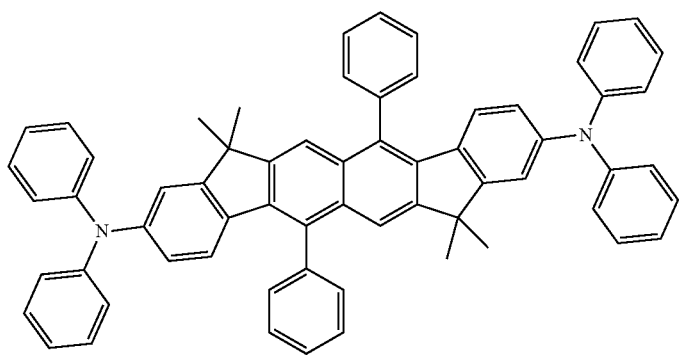
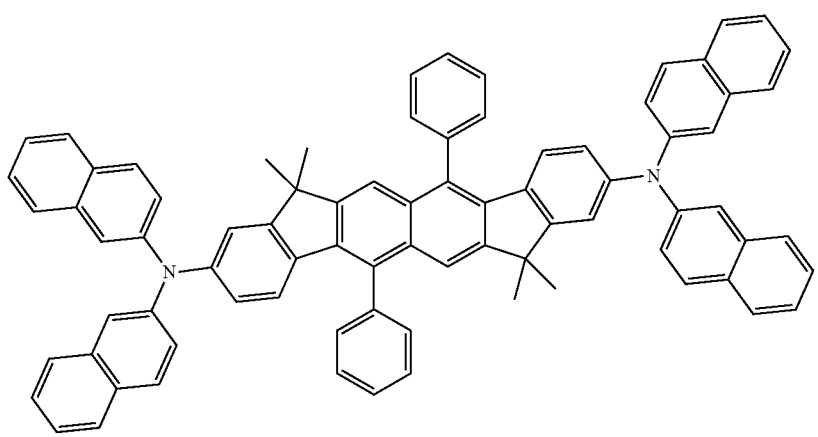

-continued
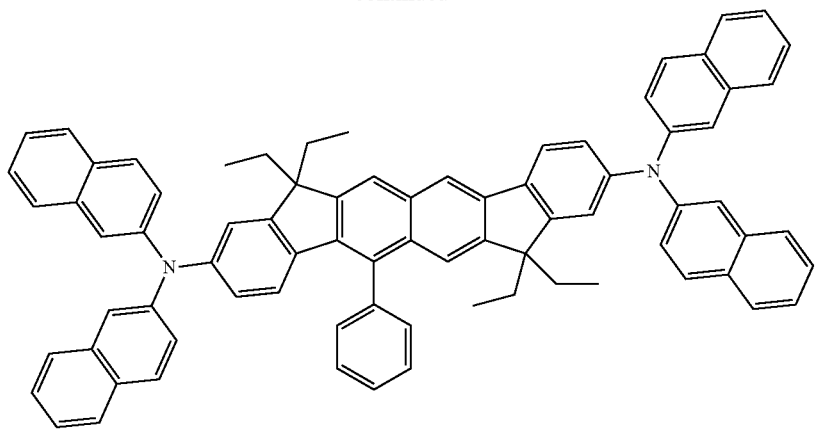
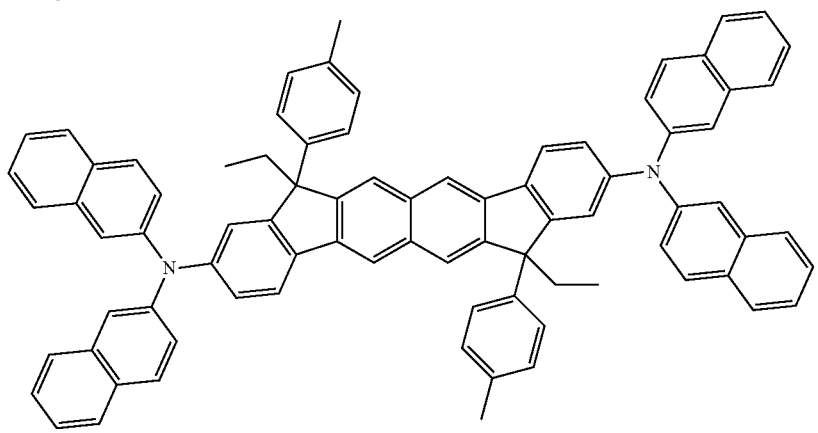
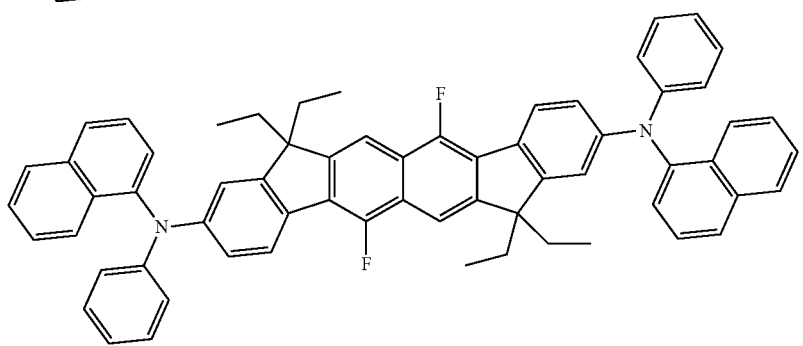
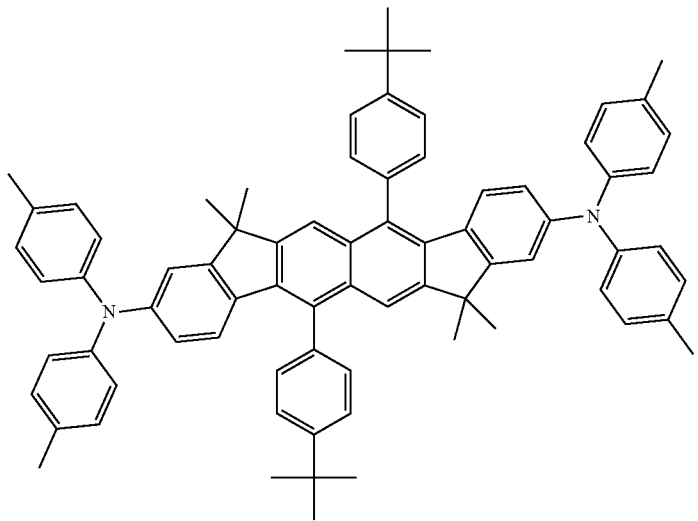

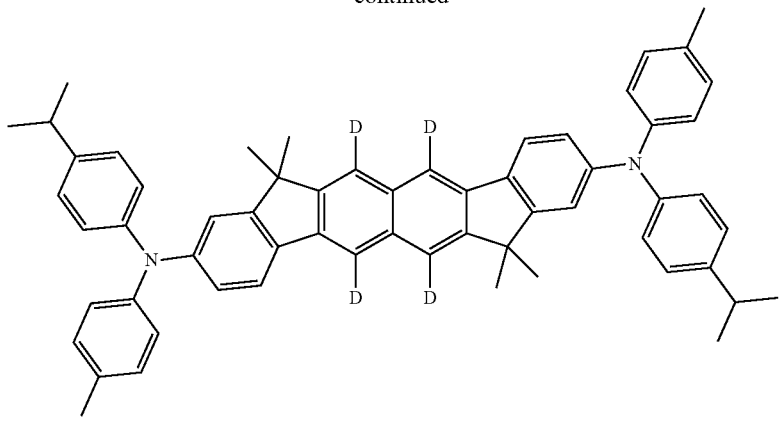

In General Formula 4, $X^{71}$ and $X^{72}$ are the same linking group and are both an oxygen atom or a sulfur atom. $R^{71}$ to $R^{76}$ are each independently a hydrogen atom or a substituent, and a plurality of $R^{71}$ to $R^{76}$ may together form a ring. $R^{81}$ to $R^{88}$ are each independently a hydrogen atom or a substituent, but if two of $X^{71}$ and $X^{72}$ are both a sulfur atom, then at least one of $R^{72}$, $R^{73}$, $R^{75}$, and $R^{76}$ is a substituent.

In General Formula 4 above, it is preferable if $X^{71}$ and $X^{72}$ are both an oxygen atom.

In General Formula 4 above, the substituents expressed by $R^{71}$ to $R^{76}$ and $R^{81}$ to $R^{88}$ are preferably an alkyl group, an aryl group, a heteroaryl group, an amino group, an alkoxy group, a halogen atom, or a silyl group, more preferably an aryl group, even more preferably a $C_6$ to $C_{20}$ aryl group, and most preferably a phenyl group.

The substituents expressed by $R^{71}$ to $R^{76}$ and $R^{81}$ to $R^{88}$ above may further have a substituent, and this substituent is preferably an alkyl group, an aryl group, a heteroaryl group, an amino group, an alkoxy group, a halogen atom, or a silyl group, more preferably an alkyl group, even more preferably a $C_1$ to $C_{10}$ alkyl group, and most preferably a $C_1$ to $C_5$ alkyl group.

Concrete examples of the compounds expressed by General Formula 4 above are given below, but the compounds expressed by General Formula 1 that can be used in the present invention should not be construed as being limited to or by these concrete examples:

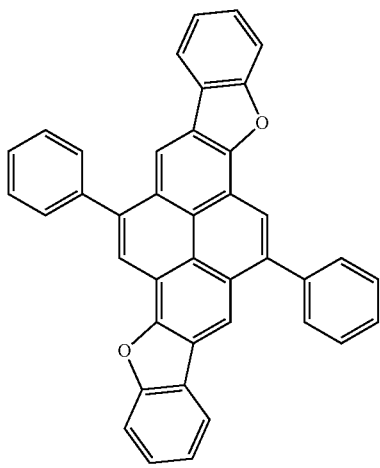

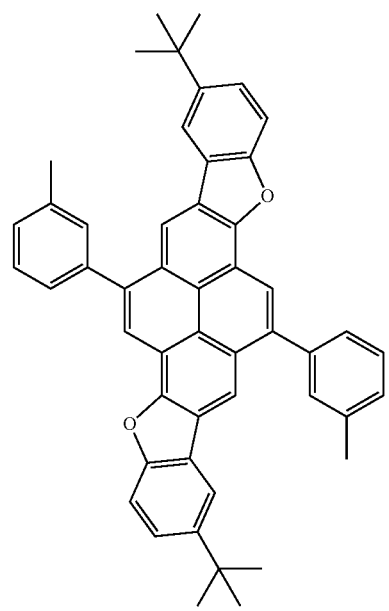

-continued
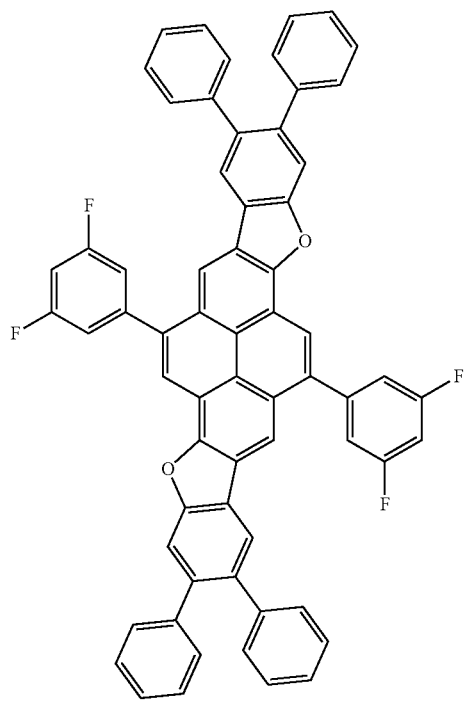
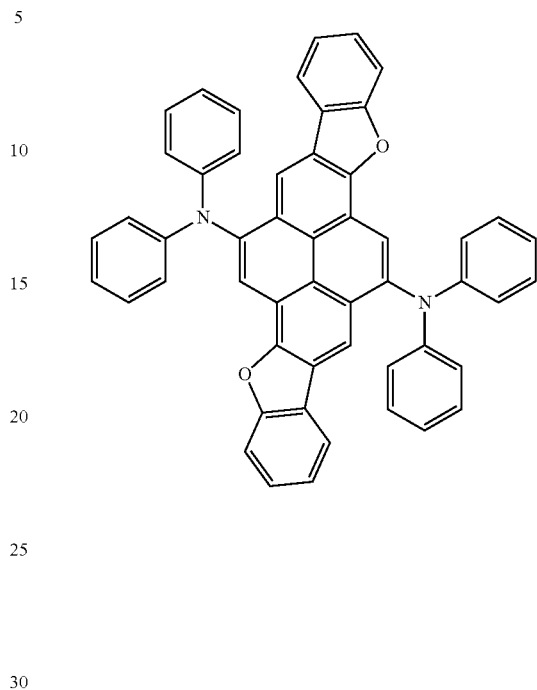
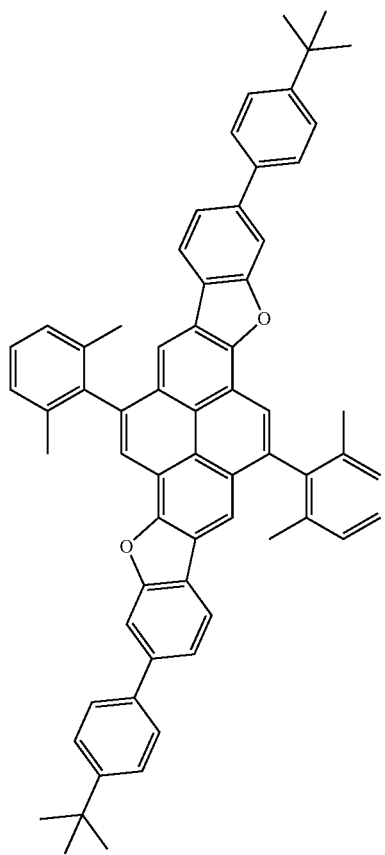
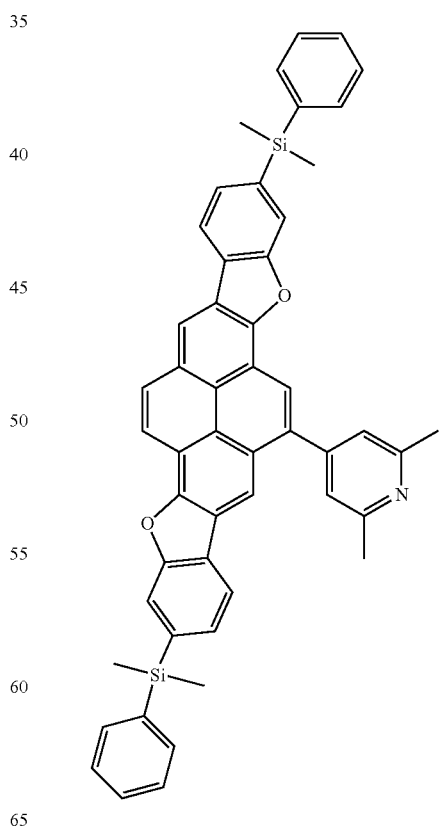

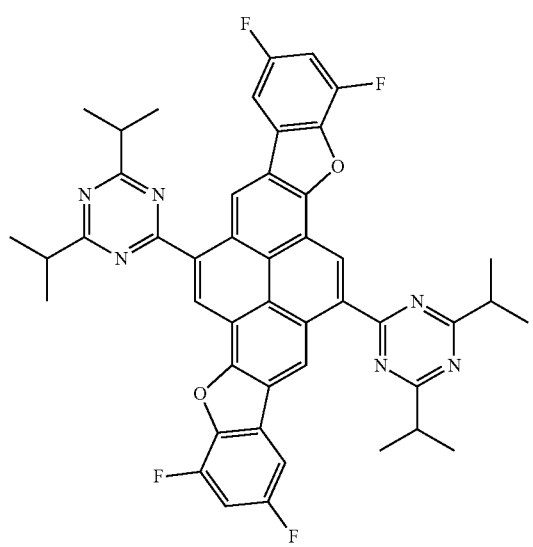
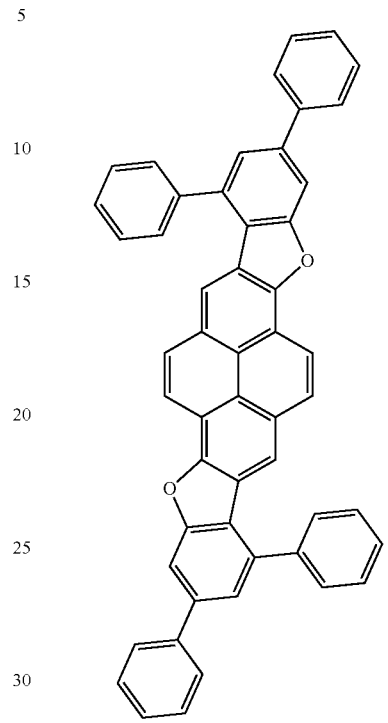
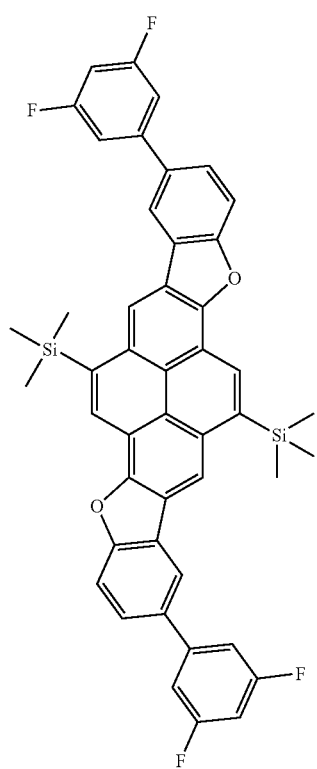
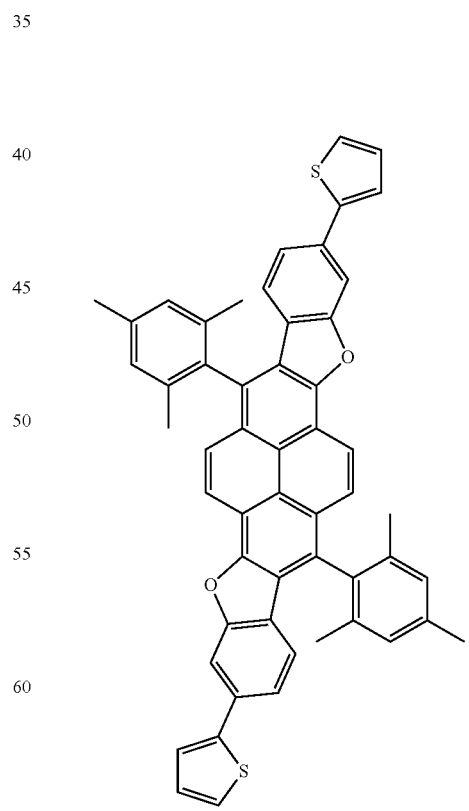

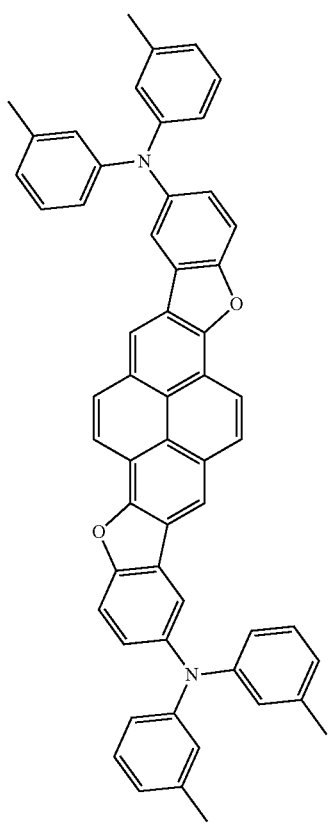
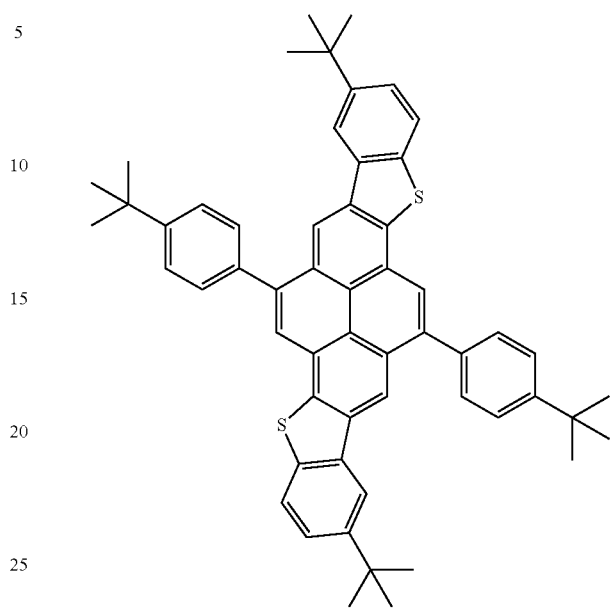
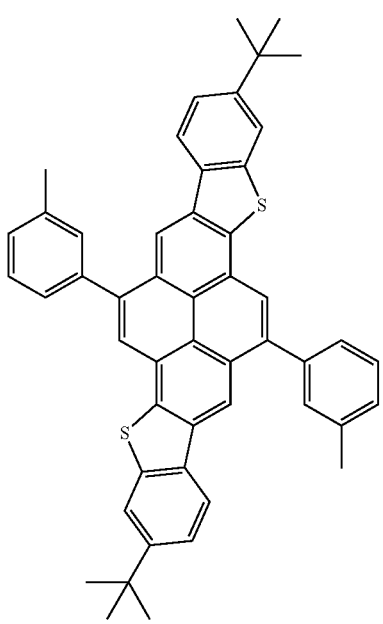
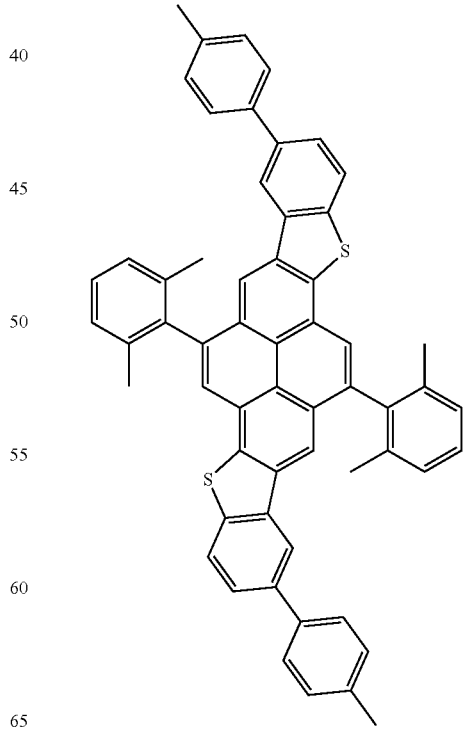

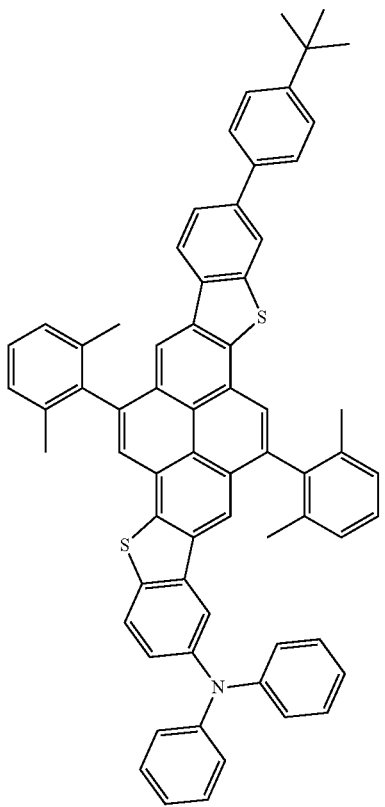
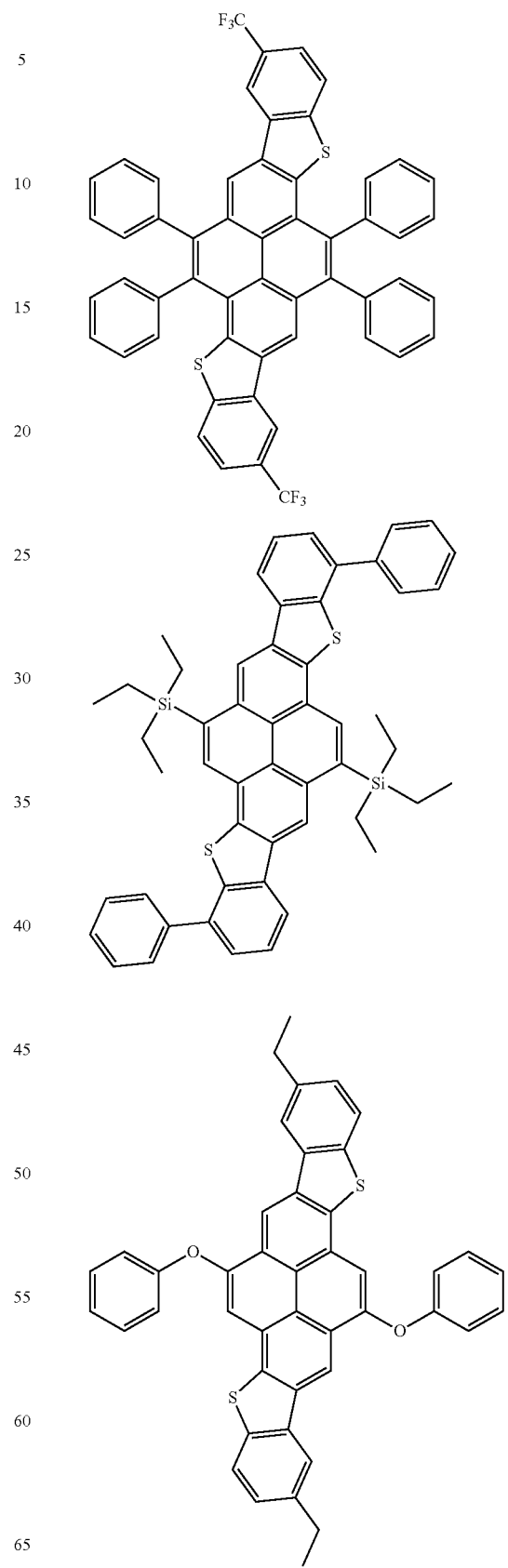

-continued

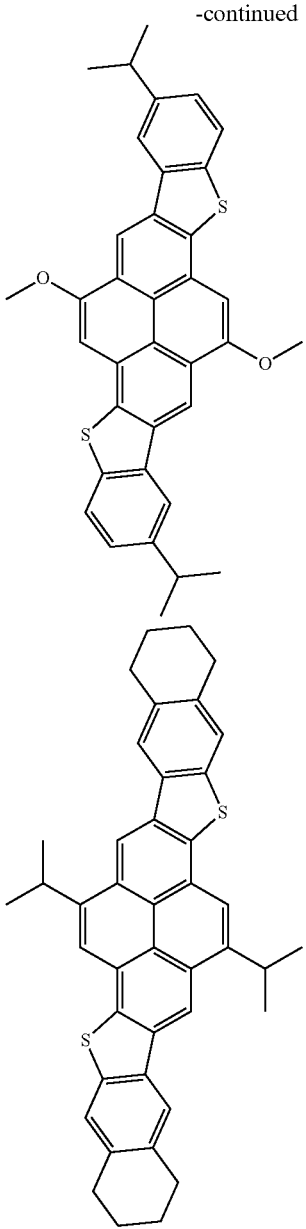

The aforementioned light-emitting material preferably has a reorganization energy in transition from a first excited singlet state ($S_1$) to a ground state ($S_0$) ($\Delta E_{S0}^{reorg}$, hereinafter referred to simply as "reorganization energy") of 0.15 eV or less.

The reorganization energy referred to here is the energy defined in *Journal of Physical Chemistry* A 2002, Vol. 106, pp. 9294-9305, which is a publicly known reference. Specifically, this is the energy difference between the total energy $E_{S0}(X_{S1})$ of $S_0$ in the most stable molecular structure of $S_1$ and the total energy $E_{S0}(X_{S0})$ of $S_0$ in the most stable molecular structure of $S_0$ ($\Delta E_{S0}^{reorg} = E_{S0}(X_{S1}) - E_{S0}(X_{S0})$, where $X_{S1}$ and $X_{S0}$ indicate the most stable molecular structures at $S_1$ and $S_0$, respectively). The method for calculating the reorganization energy in this Specification is to find $X_{S1}$ by time-dependent density functional theory (TDDFT/B3LYP/6-31G(d)) and to find $X_{S0}$, $E_{S0}(X_{S0})$, and $E_{S0}(X_{S1})$ by density functional theory (B3LYP/6-31G(d)).

It is preferable for the aforementioned reorganization energy to be 0.15 eV or less because this reduces the intensity of the vibration band on the long-wavelength side in the emission spectrum, which makes it less likely that the emission will become broad and gives blue emitted light with a high color purity.

Moreover, it is more preferable for the aforementioned reorganization energy to be 0.14 eV or less and even more preferably 0.12 eV or less.

In addition, it is preferable for the aforementioned light-emitting material to be such that PL emission of a toluene solution in which the concentration [of the host material] is no more than 10 mg/L exhibits maximum emission intensity of at least 426 nm and no more than 438 nm.

The PL emission in this Specification refers to the PL emission [obtained by] first measuring the absorption spectrum with a quartz cell (F17-UV-10, GL Sciences, Inc.) and a spectrofluoro-photometer (RF-5300PC, Shimadzu) and measuring as the excitation light wavelength the wavelength exhibiting the maximum absorbance over a wavelength range of 270 to 400 nm. Note that the aforementioned measurement can be made, for example, with a toluene solution in which the concentration of the light-emitting material is from 1 µg/L to 10 mg/L. It has been confirmed that the light-emitting material is sufficiently dilute in a toluene solution in the aforementioned concentration range and that no agglomeration or the like of the light-emitting material occurs, so there is almost no change in the wavelength at which the light-emitting material exhibits its maximum emission intensity.

It is preferable for the wavelength at which the light-emitting material exhibits its maximum emission intensity in a toluene solution of the aforementioned concentration to be at least 426 nm and no more than 438 nm because this will improve color purity and the durability of the element.

From the standpoints of stable manufacture and preventing deterioration in color purity caused by emission from agglomeration of the light-emitting material, it is preferable for the organic electroluminescent element of the present invention to be such that the light-emitting material is contained in an amount of 0.1 to 20 wt % in the aforementioned light-emitting composition containing at least one type of host material and at least one type of light-emitting material. The aforementioned light-emitting material content is more preferably 1 to 15 wt %, even more preferably 1 to 10 wt %, and most preferably 2 to 8 wt %.

Furthermore, from the standpoint of obtaining good emission from the light-emitting material, the organic electroluminescent element of the present invention is preferably such that the host material content is 20 to 99.9 wt % in the aforementioned film containing at least one type of host material and at least one type of light-emitting material. The aforementioned host material content is more preferably 50 to 99 wt % and even more preferably 80 to 97 wt %.

Moreover, the organic electroluminescent element of the present invention is preferably such that the proportion of the host material and the light-emitting material is from 99:1 to 90:10 in the aforementioned film containing at least one type of host material and at least one type of light-emitting material. The aforementioned proportion is more preferably from 97:3 to 93:7.

When an electric field is applied, the aforementioned light-emitting layer accepts holes from the anode, the hole injection layer, or the hole transport layer, accepts electrons from the cathode, the electron injection layer, or the electron transport layer, and has the function of emitting light by providing a site for the rebinding of holes and electrons.

There are no particular restrictions on the aforementioned light-emitting layer, which can be formed by a publicly known method, but it can be favorably formed, for example, by vapor deposition or another such dry film formation method, or by wet coating, transfer, printing, inkjet, or another such method.

There are no particular restrictions on the thickness of the aforementioned light-emitting layer, which can be suitably selected according to the intended purpose, but 2 to 500 nm is preferable, and from the standpoint of luminous efficiency, 3 to 200 nm is more preferable, and 10 to 200 nm is even more preferable. In addition, the aforementioned light-emitting layer may be a single layer or may be two or more layers.

(Charge Transfer Layer)

[The term] "charge transfer layer" refers to a layer in which charge movement occurs when voltage is applied to the organic electroluminescent element.

In concrete terms, examples include a hole injection layer, a hole transport layer, an electron blocking layer, a light-emitting layer, a hole blocking layer, an electron transport layer, or an electron injection layer. Preferably, this is a hole injection layer, a hole transport layer, an electron blocking layer, or a light-emitting layer. If the charge transfer layer formed by a coating method is a hole injection layer, a hole transport layer, an electron blocking layer, or a light-emitting layer, a low-cost and highly efficient organic electroluminescent element can be manufactured. Furthermore, the charge transfer layer is more preferably a hole injection layer, a hole transport layer, or an electron blocking layer.

(Hole Injection Layer and Hole Transport Layer)

The hole injection layer and hole transport layer are layers having the function of accepting holes from the anode or from the anode side and transporting them to the cathode side.

With regard to the hole injection layer and hole transport layer, what is described in paragraph numbers [0165] to [0167] in Japanese Laid-Open Patent Application 2008-270736 can be applied to the present invention.

The hole injection layer preferably contains an electron-accepting dopant. By having an electron-accepting dopant contained in the hole injection layer, there are effects such as improved hole injection characteristics, decreased drive voltage, and increased efficiency. The electron-accepting dopant may be either an organic material or inorganic material so long as it is a material that extracts electrons from the doped material and that can generate radical cations. Examples include tetracyanoquinodimethane (TCNQ), tetrafluorotetracyanoquinodimethane ($F_4$-TCNQ), and molybdenum oxide.

The electron-accepting dopant is preferably contained in the hole injection layer in an amount of 0.01 to 50 wt %, more preferably 0.1 to 40 wt %, and even more preferably 0.2 to 30 wt %, with respect to the total weight of the compound forming the hole injection layer.

(Electron Injection Layer and Electron Transport Layer)

The electron injection layer and electron transport layer are layers having the function of accepting electrons from the cathode or the cathode side and transporting them to the anode side. The electron injection material or electron transport material used in these layers may be a low-molecular-weight compound or a high-molecular-weight compound.

The electron transport material is preferably a layer containing a pyridine derivative, a quinoline derivative, a pyrimidine derivative, a pyrazine derivative, a phthalazine derivative, a phenanthroline derivative, a triazine derivative, a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyradine derivative, an aromatic tetracarboxylic anhydride such as perylene or naphthalene, a phthalocyanine derivative, various types of metal complex typified by a metal complex of an 8-quinolinol derivative, a metal phthalocyanine, and a metal complex containing benzoxazole or benzothiazole as a ligand, an organosilane derivative typified by silole, or the like.

From the standpoint of lowering the drive voltage, the thickness of the electron injection layer and the electron transport layer is preferably 500 nm or less, each.

The thickness of the electron transport layer is preferably 1 to 500 nm, more preferably 5 to 200 nm, and even more preferably 10 to 100 nm. Moreover, the thickness of the electron injection layer is preferably 0.1 to 200 nm, more preferably 0.2 to 100 nm, and even more preferably 0.5 to 50 nm.

The electron injection layer and the electron transport layer may have a single-layer structure composed of one or more types of the aforementioned materials or may have a multilayer structure composed of a plurality of layers of the same composition or different compositions.

The electron injection layer preferably contains an electron-donating dopant. By having an electron-donating dopant contained in the electron injection layer, there are effects such as improved electron injection characteristics, decreased drive voltage, and increased efficiency. The electron-donating dopant may be either an organic material or inorganic material so long as it is a material that donates electrons to the doped material and that can generate radical anions, but examples include tetrathiafulvalene (TTF), tetrathianaphthacene (TTT), bis-[1,3-diethyl-2-methyl-1,2-dihydrobenzimidazolyl] and other such dihydroimidazole compounds, lithium, and cesium.

The electron-donating dopant is preferably contained in the electron injection layer in an amount of 0.01 to 50 wt %, more preferably 0.1 to 40 wt %, and even more preferably 0.5 to 30 wt %, with respect to the total weight of the compound forming the electron injection layer.

(Hole Blocking Layer)

The hole blocking layer is a layer having the function of preventing holes transported from the anode side to the light-emitting layer from passing through to the cathode side. In the present invention, a hole blocking layer can be provided as an organic layer adjacent to the light-emitting layer on the cathode side.

Examples of the organic compound constituting the hole blocking layer include (aluminum(III) bis(2-methyl-8-quinolinato) 4-phenylphenolate (abbreviated as Balq) and other such aluminum complexes, triazole derivatives, and 2,9-dimethyl-4,7-diphenyl-1,10-phenanthroline (abbreviated as BCP) and other such phenanthroline derivatives. In the present invention, the hole blocking layer is not limited to the function of actually blocking holes and may have the function of not allowing excitons of the light-emitting layer to diffuse into the electron transport layer, or blocking energy transfer quenching.

The thickness of the hole blocking layer is preferably 1 to 500 nm, more preferably 5 to 200 nm, and even more preferably 10 to 100 nm.

The hole blocking layer may have a single-layer structure composed of one or more types of the aforementioned materials or may have a multilayer structure composed of a plurality of layers of the same composition or different compositions.

(Electron Blocking Layer)

The electron blocking layer is a layer having the function of preventing electrons transported from the cathode side to the light-emitting layer from passing through to the anode side. In the present invention, an electron blocking layer can be provided as an organic layer adjacent to the light-emitting layer on the anode side.

Examples of the organic compound constituting the electron blocking layer include those given as examples of a hole transport material above.

The thickness of the electron blocking layer is preferably 1 to 500 nm, more preferably 5 to 200 nm, and even more preferably 10 to 100 nm.

The electron blocking layer may have a single-layer structure composed of one or more types of the aforementioned materials or may have a multilayer structure composed of a plurality of layers of the same composition or different compositions.

(Protective Layer)

The entire organic EL element may be protected by a protective layer in the present invention.

With regard to a protective layer, what is described in paragraph numbers [0169] and [0170] of a publication of Japanese Laid-Open Patent Application 2008-270736 can be applied to the present invention.

<Electrodes>

The aforementioned organic electroluminescent element usually includes a pair of electrodes. It is preferable for one of the aforementioned pair of electrodes to be an electrode having a visible light transmissivity of less than 10% and for the other to be an electrode having a visible light transmissivity of at least 80%.

[The term] "visible light transmissivity" here means the transmissivity of light with a wavelength in the visible light band (380 to 780 nm), and "a visible light transmissivity of less than 10% (at least 80%)" means that "the transmissivity is less than 10% (at least 80%)" for light of all wavelengths in the visible light band.

The visible light transmissivity of the aforementioned electrode whose visible light transmissivity is less than 10% is more preferably at least 0% and less than 10% and even more preferably at least 0% and less than 5%. Moreover, the visible light transmissivity of the aforementioned electrode whose visible light transmissivity is at least 80% is more preferably at least 80% and 100% or less and even more preferably at least 90% and 100% or less.

It is preferable for the visible light transmissivity of the pair of electrodes to be within the above range because light can be taken off efficiently from one electrode, and there will be less color variance attributable to manufacturing variance.

The aforementioned pair of electrodes are generally an anode and a cathode, and it is sufficient if the anode has the function of an electrode that supplies holes to the organic layers, and the cathode has the function of an electrode that injects electrons into the organic layers.

There are no particular restrictions on the shape, structure, size, and so forth of the aforementioned electrodes, which can be suitably selected from among publicly known electrode materials as dictated by the intended application and purpose of the organic electroluminescent element.

(Anode)

Examples of the material constituting the aforementioned anode include tin oxide doped with antimony, fluorine, or the like (ATO, FTO), tin oxide, zinc oxide, indium oxide, indium tin oxide (ITO), indium zinc oxide (IZO), and other such conductive metal oxides; metals such as gold, silver, chromium, and nickel; mixtures and laminates of these metals and conductive metal oxides; inorganic conductive substances such as copper iodide and copper sulfide; organic conductive materials such as polyaniline, polythiophene, and polypyrrole; and laminates of these with ITO. Of these, conductive metal oxides are preferable, and in terms of productivity, high conductivity, transparency, and so forth, ITO is particularly favorable.

(Cathode)

Examples of the material constituting the aforementioned cathode include alkali metals (such as Li, Na, K, and Cs), alkaline earth metals (such as Mg and Ca), gold, silver, lead, aluminum, sodium-potassium alloys, lithium-aluminum alloys, magnesium-silver alloys, indium, and rare earth metals such as ytterbium. These may be used singly, but from the standpoint of achieving both stability and electron injection characteristics, two or more types can be favorably used.

Of these, alkali metals and alkaline earth metals are preferable in terms of electron injection characteristics, and a material whose main component is aluminum is particular favorable in terms of storage stability.

[The phrase] "material whose main component is aluminum" described above means either aluminum alone, an alloy of aluminum and 0.01 to 10 wt % alkali metal or alkaline earth metal, or a mixture of these (such as a lithium-aluminum alloy or a magnesium-aluminum alloy).

There are no particular restrictions on the method for forming the aforementioned electrodes, and a publicly known method can be employed, examples of which include printing, coating, and other such wet methods; vacuum vapor deposition, sputtering, ion plating, and other such physical methods; and CVD, plasma CVD, and other such chemical methods. Of these, by taking into account suitability to the material constituting the aforementioned electrodes, [the electrodes] can be formed over the aforementioned substrate by means of an appropriately selected method. For instance, when ITO is selected as the material for the aforementioned anode, it can be formed by DC or high-frequency sputtering, vacuum vapor deposition, ion plating, or another such method. When a metal or the like is selected as the material for the aforementioned cathode, it can be formed by simultaneous or successive sputtering or the like of one or more types of this [metal].

Note that when the aforementioned electrodes are patterned in their formation, this may be performed by chemical etching by photolithography or the like or by physical etching with a laser or the like. Alternatively, this may also be accomplished by using a mask and performing vacuum vapor deposition, sputtering, or the like or by a lift-off method or printing method.

In addition, the present invention relates to an organic electroluminescent element that includes a light-emitting layer composed of a light-emitting composition containing at least one type of host material and at least one type of light-emitting material, with this organic electroluminescent element being such that the aforementioned host material is a fluorescent anthracene derivative, [the material] fluoresces blue light under DC current with a current density of 25 mA/cm$^2$, the chromaticity of this fluorescent emission is CIE x≤0.18 and CIE y≤0.08, and the time it takes until the EL brightness of the front face decreases to 90% of the initial brightness when DC current is continuously supplied at a current density of 25 mA/cm$^2$ is at least 30 hours.

Here, the "EL brightness of the aforementioned front face" refers to the brightness of EL emission in the normal line direction of the emission face.

By adopting such an organic electroluminescent element, it is possible to provide a blue organic electroluminescent element with which both high color purity and good durability of the element can be achieved.

The host material and light-emitting material that can be used in the aforementioned organic electroluminescent element are the same materials as those described above, and the preferred ranges are also the same. Furthermore, preferred modes of the aforementioned organic electroluminescent element and characteristics thereof are also the same as those discussed above.

<Drive>

With the organic electroluminescent element of the present invention, emission of light can be obtained by applying DV (may include an AC component as needed) voltage (usually 2 to 15 volts) or DC current between the cathode and the anode.

Drive methods that can be applied to the method for driving the organic electroluminescent element of the present invention include those described in Japanese Laid-Open Patent Applications H2-148687, H6-301355, H5-29080, H7-134558, H8-234685, and H8-241047, and the Specifications of Japanese Patent No. 2,784,615, U.S. Pat. Nos. 5,828,429, 6,023,308, and so on.

(Applications of the Element of the Present Invention)

The element of the present invention can be utilized favorably in display elements, displays, backlights, electronic photography, illumination light sources, recording light sources, exposure light sources, reading light sources, signage, advertising signs, interior lighting, optical communication, and so forth.

(Light-Emitting Device)

Next, the light-emitting device of the present invention will be described with reference to FIG. 4.

The light-emitting device of the present invention is constituted by making use of the aforementioned organic electroluminescent element.

Figure 4:
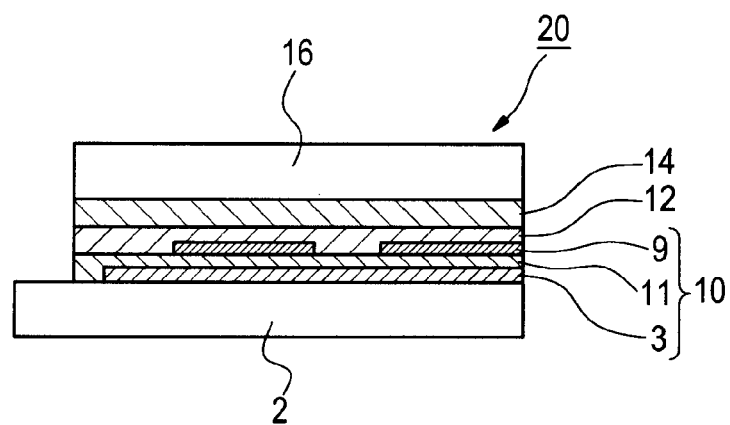
FIG. 4 is a schematic diagram showing one example of the light-emitting device according to the present invention.

FIG. 4 is a sectional view schematically showing one example of the light-emitting device of the present invention. A light-emitting device 20 in FIG. 4 is made up of a substrate (supporting substrate)2, an organic electroluminescent element 10, a sealing container 16, and so on.

The organic electroluminescent element 10 is configured by successively laminating an anode (first electrode) 3, an organic layer 11, and a cathode (second electrode) 9 over the substrate 2. Moreover, a protective layer 12 is laminated over the cathode 9, and the sealing container 16 is further provided via an adhesive layer 14 over the protective layer 12. Note that parts of the electrodes 3 and 9, partitions, insulating layers, and so forth are not depicted.

Here, an epoxy resin or other such photosetting adhesive agent or thermosetting adhesive agent can be used as the adhesive layer 14, and a thermosetting adhesive sheet, for example, can also be used.

There are no particular restrictions on the applications of the light-emitting device of the present invention, and besides lighting devices, conceivable examples include display devices of television sets, personal computers, portable telephones, electronic paper, and the like.

(Lighting Device)

Next, the lighting device of the present invention will be described with reference to FIG. 5.

Figure 5:
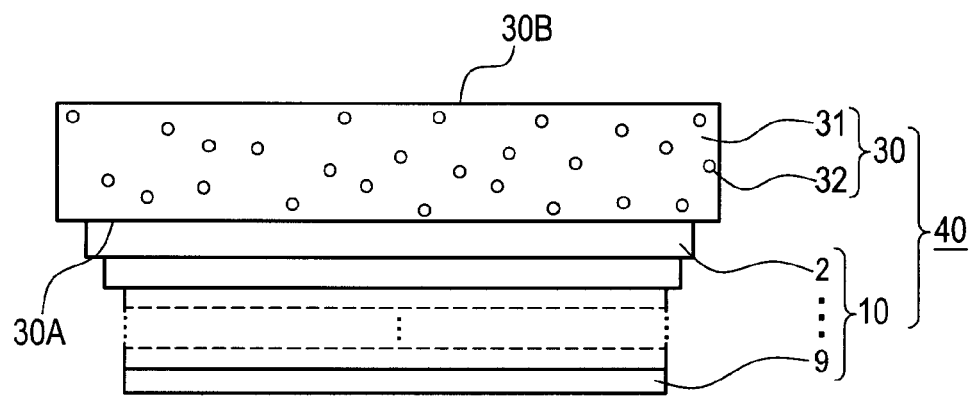
FIG. 5 is a schematic diagram showing one example of the lighting device according to the present invention.

FIG. 5 is a sectional view schematically showing one example of the lighting device of the present invention. As is shown in FIG. 5, the lighting device 40 of the present invention comprises the aforementioned organic EL element 10 and a light scattering member 30. More concretely, the lighting device 40 is configured such that the light scattering member 30 is in contact with the substrate 2 of the organic EL element 10.

There are no particular restrictions on the light scattering member 30 so long as it can scatter light, but in FIG. 5, this member comprises microparticles 32 dispersed on a transparent substrate 31. A glass substrate can be cited favorably as an example of the transparent substrate 31. As the microparticles 32, transparent resin microparticles can be favorably cited. Publicly known [materials] can be used for both the glass substrate and transparent resin microparticles. With such a lighting device 40, when light emitted from the organic electroluminescent element 10 is incident on a light incidence face 30A of the light scattering member 30, the incident light is scattered by the light scattering member 30, and the scattered light is emitted as illumination light from a light emission face 30B.

WORKING EXAMPLES

The present invention will be described in further detail based on working examples, but the present invention is not limited to or by these.

<Production of PL Emission Spectrum Measurement Sample>

A film composed of a light-emitting composition was co-vapor-deposited so as to obtain a film thickness of 50 nm over a quartz substrate measuring 25 mm². Aluminum was subsequently vapor-deposited so as to obtain [a thickness of] 100 nm.

[Then,] without coming into contact with the air, this laminate film was placed in a glove box that had been replaced with nitrogen gas, and [this box] was sealed using a sealing canister made of glass and a UV curing adhesive agent (XNR5516HV made by Nagase Ciba), which gave a PL emission spectrum measurement sample.

<Production of Organic Electroluminescent Element>

An organic film was formed by successive vacuum vapor deposition of elements with the following configuration onto a glass substrate from the anode side, and [this product] was sealed by the same method as that used for the PL emission spectrum measurement sample, which gave an organic electroluminescent element.

ITO (70)/HIL (10)/HTL (30)/EML (30)/ETL (30)/LiF (1)/Al (100)

Here, [the numbers] in parentheses express the film thickness (in units of nm) of each layer.

The following material was used for the HIL (hole injection layer):

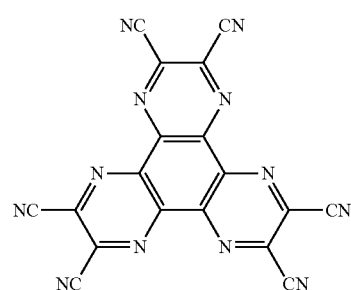 [SMILES: N#Cc1nc2c3nc(C#N)c(C#N)nc3c3nc(C#N)c(C#N)nc3c2nc1C#N]

The following material was used for the HTL (hole transport layer):

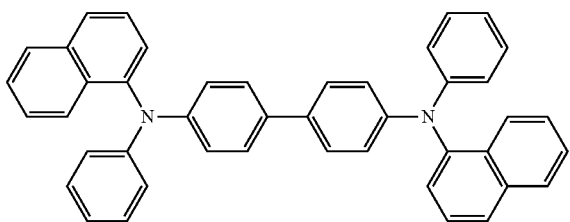 [SMILES: c1ccc(N(c2ccc(-c3ccc(N(c4ccccc4)c4cccc5ccccc45)cc3)cc2)c2cccc3ccccc23)cc1]

Materials [obtained by] mixing the host materials and the light-emitting materials described in the following working examples and comparative examples, in the given concentrations of the light-emitting materials, were used for the EML (light-emitting layer).

The following material was used for the ETL (electron transport layer):

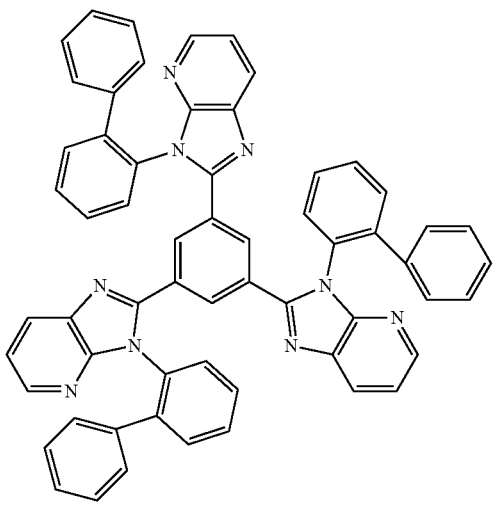 [SMILES: c1ccc(-c2ccccc2-n2c(-c3cc(-c4nc5cccnc5n4-c4ccccc4-c4ccccc4)cc(-c4nc5cccnc5n4-c4ccccc4-c4ccccc4)c3)nc3cccnc32)cc1]

Working Example 1

A host 1 constituting the host material and a compound 1 constituting the light-emitting material were mixed in a weight ratio of 97:3, and [this mixture] was used as the material (light-emitting composition) of the light-emitting layer and a film composed of the light-emitting composition.

Then, the PL emission spectrum measurement sample and organic electroluminescent element of Working Example 1 were obtained by the aforementioned methods.

<Measurement of Chromaticity of Light Emitted from Organic Electroluminescent Element>

By using a Source Measure Unit Model 2400 made by Keithley, a DC current with a current density of 25 mA/cm$^2$ was sent to the produced organic electroluminescent element, which caused the element to emit light. The emission spectrum was measured using an SR-3 brightness meter made by Topcon, and the CIE x and CIE y values for chromaticity of the resulting emission spectrum were calculated by the International Display Method established in 1931 by the International Commission on Illumination (CIE). The results are given in Table 1.

<Measurement of Electrode Transmissivity>

A glass substrate on which ITO had been vapor-deposited, which was obtained in the process of producing the organic electroluminescent element, was used as a measurement sample, a glass substrate on which ITO had not been vapor-deposited was used as a reference, and the transmissivity of the ITO electrodes was measured with a U-3310 spectrophotometer made by Hitachi, Ltd.

In addition, a glass substrate on which aluminum had been vapor-deposited [in a thickness of] 100 nm was used as a measurement sample, a glass substrate on which no aluminum had been vapor-deposited was used as a reference, and the transmissivity of the aluminum electrodes was measured in the same manner as described above.

As a result of the measurement, the transmissivity of the ITO electrodes was found to be at least 80% with respect to light of all wavelengths from 380 to 780 nm (visible light band), and the transmissivity of the aluminum electrodes was found to be less than 10% with respect to light of all wavelengths from 380 to 780 nm (visible light band).

<Calculation of Host Emission Intensity Ratio>

By using a UV-visible fiber light source (L10290 [made by] Hamamatsu Photonics), a spectrometer (QE65000 [made by] Ocean Optics), and a UV transmission filter (S76-UG5 [made by] Suruga Seiki), a film composed of only the host material is irradiated from the substrate side with excitation light with a wavelength of 310 nm, and the PL emission spectrum was measured. The shortest wavelength $\lambda$ (nm) out of the wavelengths at which the intensity was one-half the maximum emission intensity was found from the resulting PL emission spectrum.

Next, the PL emission spectrum was measured for a film composed of the light-emitting composition by the same method as that used to find $\lambda$ described above, and the ratio of the emission intensity at the aforementioned wavelength $\lambda$ to the maximum emission intensity was calculated. The results are given in Table 1.

A: host emission intensity ratio≤0.05
B: 0.05<host emission intensity ratio≤0.1
C: 0.1<host emission intensity ratio <Calculation of Reorganization Energy>

The reorganization energy is the energy defined in *Journal of Physical Chemistry*, A 2002, Vol. 106, pp. 9294-9305, which is a publicly known reference. The calculation thereof was performed as follows, using a quantum chemical calculation program, Gaussian 09, Revision A.02:

First, the most stable structure ($X_{S0}$) at the ground state ($S_0$) of the aforementioned light-emitting material molecule was found, and the total energy $E_{S0}(X_{S0})$ of the molecule in this structure was calculated. Then, the most stable structure ($X_{S1}$) in the first excited singlet state ($S_1$) of the molecule was found, and the total energy $E_{S0}(X_{S1})$ of the molecule in the ground state in this structure was calculated. Of these, $X_{S1}$ was found by time-dependent density functional theory (TDDFT/B3LYP/6-31G(d)), and $X_{S0}$, $E_{S0}(X_{S0})$, and $E_{S0}(X_{S1})$ were found by density functional theory (B3LYP/6-31G(d)).

The reorganization energy $\Delta E_{S0}^{reorg} = E_{S0}(X_{S1}) - E_{S0}(X_{S0})$ was calculated in eV units from $E_{S0}(X_{S0})$ and $E_{S0}(X_{S1})$ above. The results are given in Table 1.

<Measurement of PL Emission of Toluene Solution>

The maximum emission intensity of PL emission of a toluene solution in which the concentration of the light-emitting material was 10 mg/L or less was measured as follows:

The light-emitting material was dissolved in toluene to obtain a toluene solution of 1 mg/L. The toluene solution of the light-emitting material thus obtained was put in a quartz cell (F17-UV-10, GL Sciences, Inc.), and the absorption spectrum was measured with a spectrofluorophotometer (RF-5300PC, Shimadzu). Then, using the wavelength indicating the maximum absorbance within a wavelength range of 270 to 400 nm in this absorption spectrum as the excitation light wavelength, the PL emission spectrum of the toluene solution of the aforementioned light-emitting material was measured. The wavelength indicating the maximum emission intensity (nm; hereinafter also referred to as "toluene solution peak") was found from the resulting PL emission spectrum. The results are given in Table 1.

<Measurement of PL Emission Spectrum>

By using a UV-visible fiber light source (L10290 [made by] Hamamatsu Photonics) and a spectrometer (QE65000 [made by] Ocean Optics), the light from a deuterium lamp built into the light source was taken off and passed through a UV transmission filter (S76-UG5 [made by] Suruga Seiki), the film composed of the aforementioned light-emitting composition was irradiated with the excitation light from the substrate side, and the PL emission spectrum was obtained. From the spectrum thus obtained, the CIE y value is calculated by the International Display Method established in 1931 by the International Commission on Illumination CIE. The evaluation of color purity was performed as follows: The results are given in Table 1.

A: those resulting in CIE y≤0.08

B: those resulting in CIE y>0.08

<Measurement of Element Durability>

Using a Source Measure Unit Model 2400 made by Keithley, a DC current with a current density of 25 mA/cm² was sent continuously to the produced element, and the time (hours) it took for the emission brightness of the element to decrease to 90% of the initial brightness was measured. The results are given in Table 1.

[Working Examples 2 to 10 and Comparative Examples 1 to 14]

Other than using the host materials and light-emitting materials given in Table 1, the PL emission spectrum measurement samples and organic electroluminescent elements of Working Examples 2 to 10 and Comparative Examples 1 to 14 were obtained by the same method as in Working Example 1.

Then, the various categories were evaluated in the same manner as in Working Example 1. The results are given in Table 1.

The host materials and light-emitting materials used in the working examples are given below:

Host 1

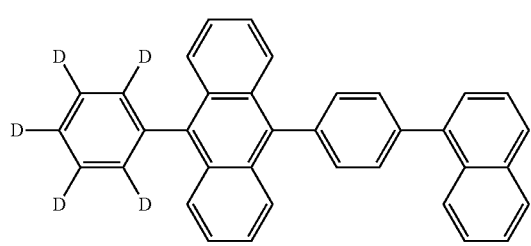

Host 2

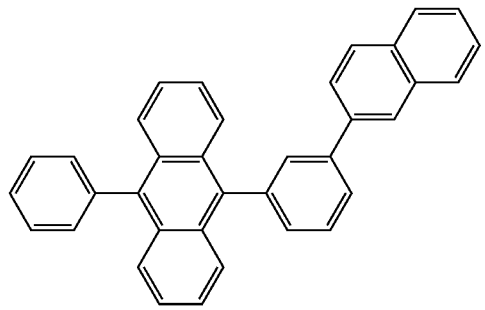

Host 3

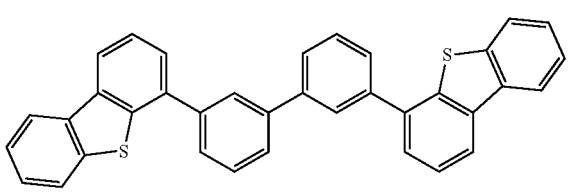

Compound 1

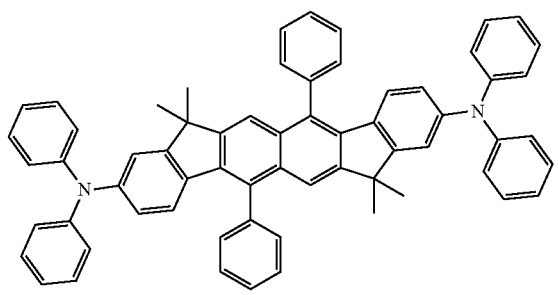

Compound 2

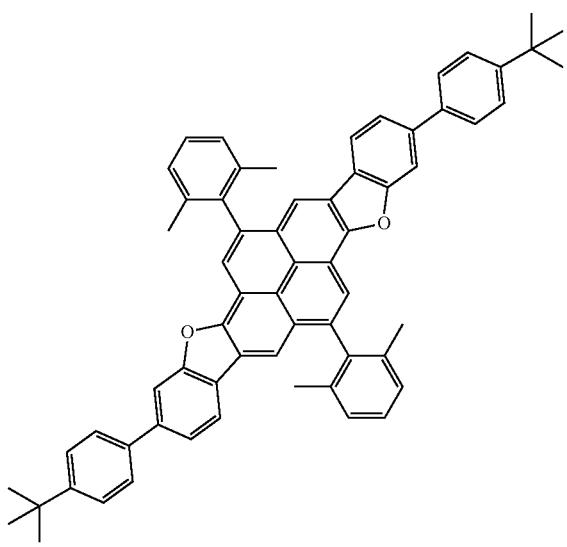

Compound 3
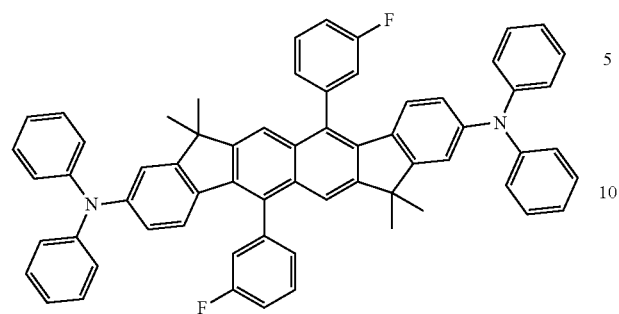
Compound 4
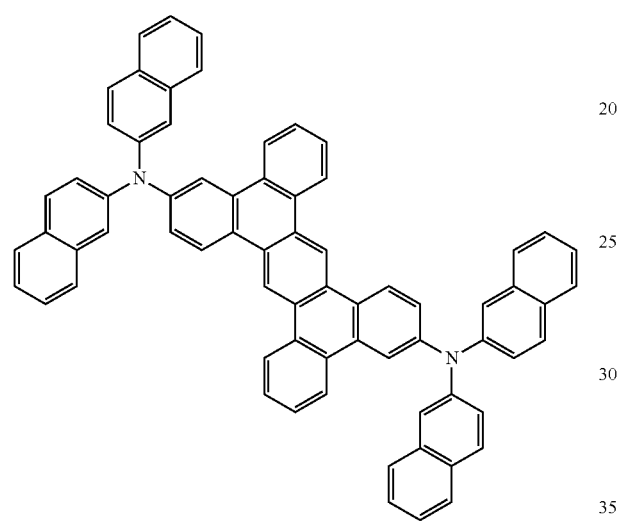
Compound 5
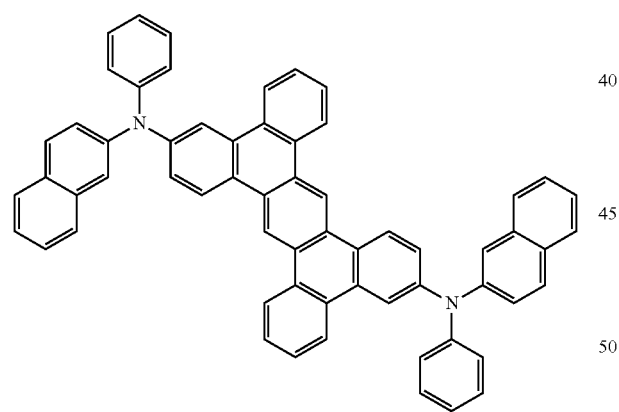
Compound 6
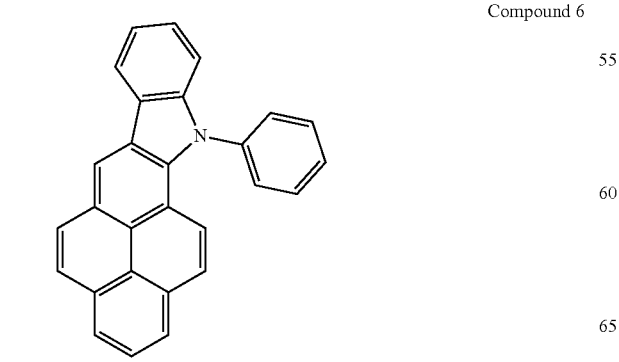
Compound 7
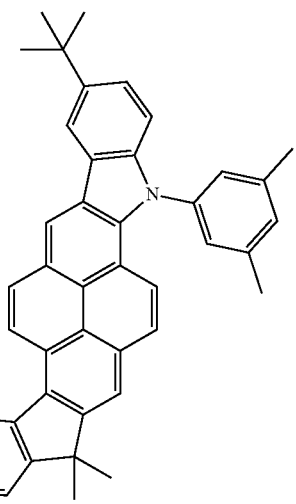
Compound 8
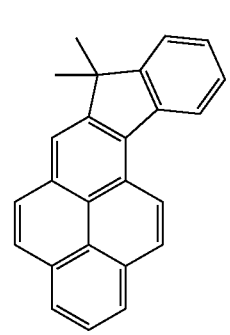
Compound 9
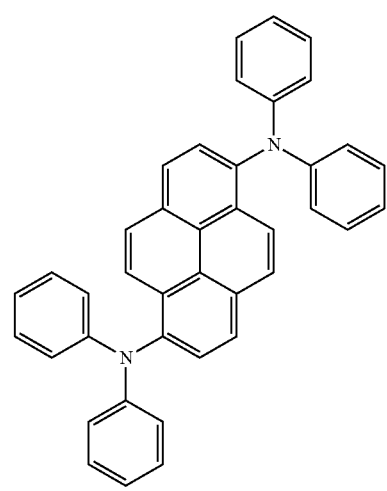

-continued

Compound 10

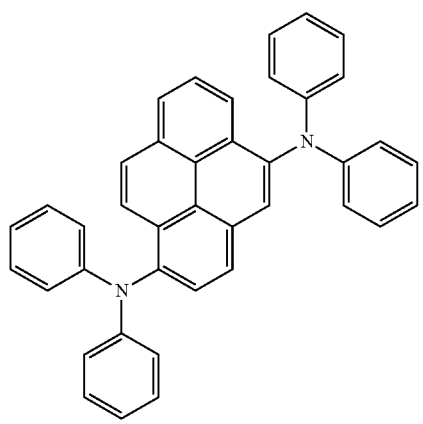

Compound 11

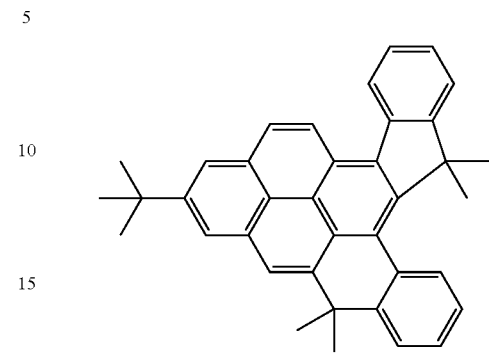

TABLE 1

| | Host | Light-emitting material | Light-emitting material concentration (wt %) | Chromaticity of emission of organic electroluminescence element (CIE x, CIE y) @ 25 mA/cm² | Host emission intensity ratio | $\Delta E_{S0}^{reorg}$ (eV) | Toluene solution peak (nm) | CIE y | Element durability (hours) |
|---|---|---|---|---|---|---|---|---|---|
| Working Ex. 1 | host 1 | compound 1 | 3 | (0.15, 0.06) | B | 0.12 | 426 | A | 65 |
| Working Ex. 2 | host 1 | compound 2 | 7 | (0.15, 0.06) | A | 0.11 | 438 | A | 117 |
| Working Ex. 3 | host 1 | compound 3 | 3 | (0.15, 0.08) | A | 0.14 | 432 | A | 104 |
| Working Ex. 4 | host 1 | compound 4 | 5 | (0.15, 0.06) | A | 0.15 | 430 | A | 100 |
| Working Ex. 5 | host 1 | compound 5 | 5 | (0.15, 0.06) | B | 0.14 | 428 | A | 65 |
| Working Ex. 6 | host 2 | compound 1 | 3 | (0.15, 0.06) | B | 0.12 | 426 | A | 66 |
| Working Ex. 7 | host 2 | compound 2 | 7 | (0.15, 0.06) | A | 0.11 | 438 | A | 120 |
| Working Ex. 8 | host 2 | compound 3 | 3 | (0.15, 0.08) | A | 0.14 | 432 | A | 104 |
| Working Ex. 9 | host 2 | compound 4 | 5 | (0.15, 0.06) | A | 0.15 | 430 | A | 93 |
| Working Ex. 10 | host 2 | compound 5 | 5 | (0.15, 0.06) | B | 0.14 | 428 | A | 66 |
| Comparative Ex. 1 | host 1 | compound 6 | 3 | (0.15, 0.08) | C | 0.11 | 420 | A | 3 |
| Comparative Ex. 2 | host 1 | compound 7 | 3 | (0.15, 0.18) | A | 0.12 | 453 | B | 78 |
| Comparative Ex. 3 | host 2 | compound 6 | 5 | (0.15, 0.08) | C | 0.11 | 420 | A | 2 |
| Comparative Ex. 4 | host 2 | compound 7 | 5 | (0.15, 0.18) | A | 0.12 | 453 | B | 71 |
| Comparative Ex. 5 | host 1 | compound 8 | 3 | (0.15, 0.08) | C | 0.15 | 397 | A | 0.8 |
| Comparative Ex. 6 | host 1 | compound 9 | 7 | (0.14, 0.16) | A | 0.14 | 454 | B | 77 |
| Comparative Ex. 7 | host 2 | compound 8 | 3 | (0.15, 0.08) | C | 0.15 | 397 | A | 0.5 |
| Comparative Ex. 8 | host 2 | compound 9 | 7 | (0.14, 0.16) | A | 0.14 | 454 | B | 73 |
| Comparative Ex. 9 | host 1 | compound 10 | 7 | (0.15, 0.14) | B | 0.27 | 446 | B | 50 |
| Comparative Ex. 10 | host 1 | compound 11 | 5 | (0.16, 0.26) | B | 0.17 | 438 | B | 54 |
| Comparative Ex. 11 | host 2 | compound 10 | 7 | (0.15, 0.14) | B | 0.27 | 446 | B | 43 |
| Comparative Ex. 12 | host 2 | compound 11 | 5 | (0.16, 0.26) | B | 0.17 | 438 | B | 39 |

TABLE 1-continued

| | Host | Light-emitting material | Light-emitting material concentration (wt %) | Chromaticity of emission of organic electroluminescence element (CIE x, CIE y) @ 25 mA/cm² | Host emission intensity ratio | $\Delta E_{S0}^{reorg}$ (eV) | Toluene solution peak (nm) | CIE y | Element durability (hours) |
|---|---|---|---|---|---|---|---|---|---|
| Comparative Ex. 13 | host 3 | compound 6 | 3 | (0.15, 0.05) | A | 0.11 | 420 | A | 0.2 |
| Comparative Ex. 14 | host 3 | compound 11 | 5 | (0.16, 0.28) | A | 0.17 | 438 | B | 0.3 |

It was found from the aforementioned results that the organic electroluminescent element of the present invention (working examples) is a blue organic electroluminescent element that is satisfactory at a high level in terms of the color purity and durability of the element.

On the other hand, it was found that the organic electroluminescent elements of the comparative examples could not achieve both good element durability and high color purity, as described below.

In Comparative Examples 1, 3, 5, and 7, the peak of the toluene solution of the light-emitting material contained in the light-emitting layer was shorter than 426 nm. Consequently, the lowest excited singlet states ($S_1$) of the host material and light-emitting material are closer together, and it is less likely that energy transfer from the host to the light-emitting material will occur, so there is more host emission, and the host emission intensity ratio ends up exceeding 1/10. It is believed that this results in a decrease in the durability of the element.

In Comparative Examples 2, 4, 6, 8, 9, and 11, the peak of the toluene solution of the light-emitting material contained in the light-emitting layer was longer than 438 nm. Consequently, the spectrum was such that the emission components corresponding to green and red, which adversely affect blue purity, increased over those in a spectrum having the proper emission peak. It is believed that this results in a decrease in color purity.

In Comparative Examples 10 and 12, the peak of the toluene solution of the host material contained in the light-emitting layer was within the proper range, but it is believed that the reorganization energy $\Delta E_{S0}^{reorg}$ of the light-emitting material was greater, and the emission was broader, so the color purity decreased.

In Comparative Examples 13 and 14, the host material was not an anthracene derivative, but rather a host material with higher energy in the S1 state than that with an anthracene derivative. Accordingly, even with a light-emitting material whose toluene solution peak is shorter than the proper range as in Comparative Example 13, the host material does not emit light, and good emission is obtained from the light-emitting material. On the other hand, because the S1 state of the host material is extremely unstable, the host material has poor stability and is prone to decomposition. As a result, it seems to be impossible to achieve both color purity and durability of the element.

DESCRIPTION OF SYMBOLS 2 substrate
3 anode
4 hole injection layer
5 hole transport layer
6 light-emitting layer
7 hole blocking layer
8 electron transport layer
9 cathode
10 organic electroluminescent element
11 organic layer
12 protective layer
14 adhesive layer
16 sealing container
20 light-emitting device
30 light scattering member
30A light incidence face
30B light emission face
31 transparent substrate
32 microparticles
40 lighting device

The invention claimed is:

1. An organic electroluminescent element that includes a light-emitting layer composed of a light-emitting composition containing at least one type of host material and at least one type of light-emitting material, wherein
said host material is a fluorescent anthracene derivative, the light-emitting material fluoresces blue light under DC current with a current density of 25 mA/cm²,
if λ (nm) is taken to be the shortest wavelength of all the wavelengths at which the intensity of photoluminescence ("PL") emission of a film composed only of said host material is one-half the maximum emission intensity, then the intensity of PL emission at said wavelength λ of a film composed of said light-emitting composition is no more than 1/10 the maximum emission intensity of PL emission of the film composed of said light-emitting composition, and
the PL emission of the film composed of said light-emitting composition satisfies CIE y≤0.08.

2. The organic electroluminescent element according to claim 1, wherein the reorganization energy of said light-emitting material in a transition from a first excited singlet state ($S_1$) to a ground state ($S_0$) is 0.15 eV or less.

3. The organic electroluminescent element according to claim 1, wherein PL emission of a toluene solution in which the concentration of said light-emitting material is no more than 10 mg/L exhibits a maximum emission intensity of at least 426 nm and no more than 438 nm.

4. The organic electroluminescent element according to claim 1, wherein the intensity of PL emission at said wavelength λ of the film composed of said light-emitting composition is no more than 1/20 the maximum emission intensity of the PL emission of the film composed of said light-emitting composition.

5. The organic electroluminescent element according to claim 1, wherein said host material is a fluorescent anthracene derivative expressed by General Formula 1 below:

General Formula 1

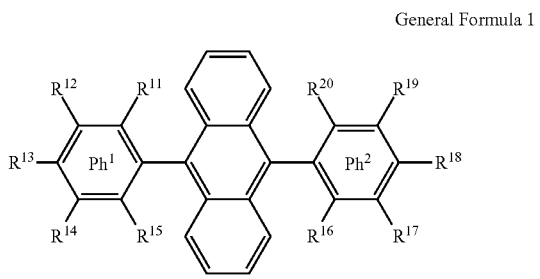

where in General Formula 1, $Ph^1$ is a phenyl group; $Ph^2$ is a phenylene group; $R^{11}$ to $R^{15}$ are each independently a hydrogen atom (including a deuterium atom), an alkyl group, or a silyl group, and $R^{11}$ to $R^{15}$ will not bond together to form a ring; one of $R^{16}$ to $R^{20}$ is an aryl group, and the others of $R^{16}$ to $R^{20}$ are each independently a hydrogen atom (including a deuterium atom) or an alkyl group, and $R^{16}$ to $R^{20}$ will not bond together to form a ring.

6. The organic electroluminescent element according to claim 1, wherein said light-emitting material is a material expressed by General Formula 2, 3, or 4 below:

General Formula 2

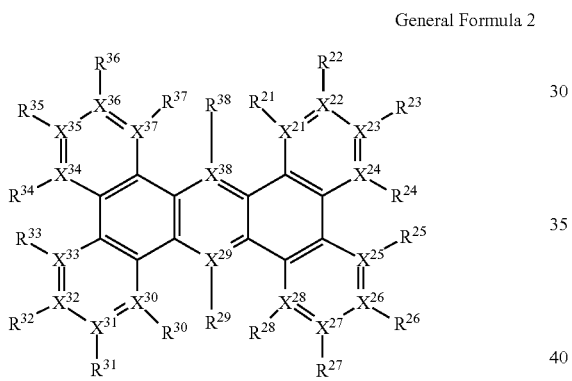

where in General Formula 2, $R^{21}$ to $R^{38}$ are each independently a hydrogen atom or a substituent, at least one of $R^{21}$ to $R^{28}$ and $R^{30}$ to $R^{37}$ is $-L^{21}-NR^{39}R^{40}$ ($R^{39}$ and $R^{40}$ are each independently an alkyl group, an aryl group, or a heteroaryl group, $R^{39}$ and $R^{40}$ may together form a ring, and $L^{21}$ is a single bond or a divalent linking group); and $X^{21}$ to $X^{38}$ are each independently a hydrogen atom or a nitrogen atom, and if $X^{21}$ to $X^{38}$ express a nitrogen atom, there is no $R^{21}$ to $R^{38}$ bonded thereto, General Formula 3

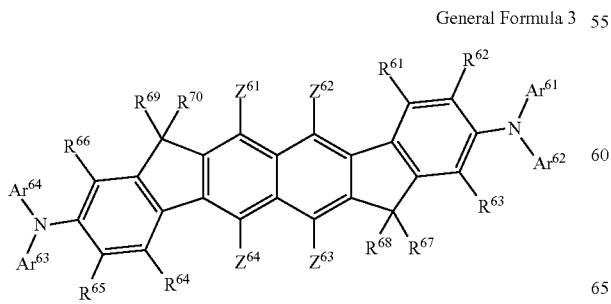

where in General Formula 3, $R^{61}$ to $R^{66}$ are each independently a hydrogen atom or a substituent, and $R^{61}$ and $R^{62}$, and $R^{64}$ and $R^{65}$ may respectively bond together to form a ring;

$R^{67}$ to $R^{70}$ are each independently an aryl group or a $C_1$ to $C_5$ alkyl group; when $R^{67}$ and $R^{68}$ are alkyl groups or substituents having an alkyl chain, the sum of the carbon numbers of the alkyl groups expressed by these groups is 2 to 8, and when $R^{69}$ and $R^{70}$ are alkyl groups or substituents having an alkyl chain, the sum of the carbon numbers of the alkyl groups expressed by these groups is 2 to 8;

$Z^{61}$ and $Z^{62}$, and $Z^{63}$ and $Z^{64}$ may respectively bond together to form a ring, but will not form an aromatic ring; if $Z^{61}$ and $Z^{62}$, and $Z^{63}$ and $Z^{64}$ respectively bond together to form a ring, then $Z^{61}$ to $Z^{64}$ are each independently an alkyl group (but $Z^{61}$ and $Z^{62}$ will not both be an alkyl group, and $Z^{63}$ and $Z^{64}$ will not both be an alkyl group), an aryl group, a heteroaryl group, a silyl group, —O—, or —NY— (where Y is an alkyl group or an aryl group); if $Z^{61}$ and $Z^{62}$, and $Z^{63}$ and $Z^{64}$ respectively do not bond together to form a ring, then $Z^{61}$ to $Z^{64}$ are each independently a hydrogen atom (including a deuterium atom), an alkyl group, an aryl group, a heteroaryl group, a fluorine atom, a silyl group, or a cyano group; $Z^{61}$ to $Z^{64}$ may further have a substituent; and $Ar^{61}$ to $Ar^{64}$ are each independently an alkyl group, an aryl group, or a heteroaryl group, and may bond together to form a ring, General Formula 4

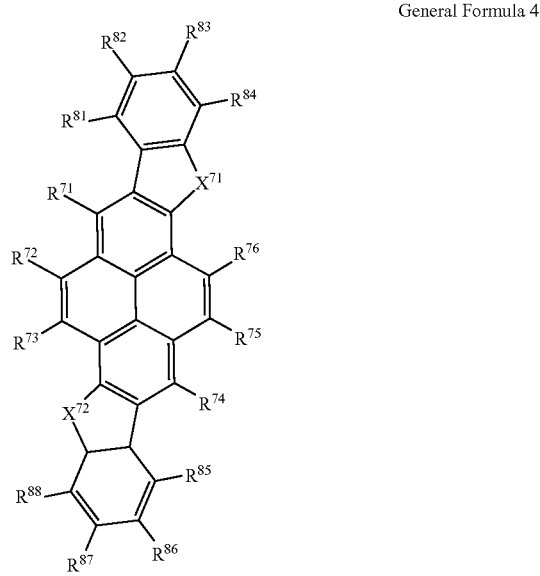

where in General Formula 4, $X^{71}$ and $X^{72}$ are the same linking group and are both an oxygen atom or a sulfur atom; $R^{71}$ to $R^{76}$ are each independently a hydrogen atom or a substituent, and a plurality of $R^{71}$ to $R^{76}$ may together form a ring; $R^{81}$ to $R^{88}$ are each independently a hydrogen atom or a substituent, but if two of $X^{71}$ and $X^{72}$ are both a sulfur atom, then at least one of $R^{72}$, $R^{73}$, $R^{75}$, and $R^{76}$ is a substituent.

7. The organic electroluminescent element according to claim 1, wherein the amount of the light-emitting material contained in said light-emitting composition is 0.1 to 20 wt %.

8. An organic electroluminescent element that includes a light-emitting layer composed of a light-emitting composition containing at least one type of host material and at least one type of light-emitting material, wherein
 said host material is a fluorescent anthracene derivative,
 the light-emitting material fluoresces blue light under DC current with a current density of 25 mA/cm$^2$, and
 the chromaticity of this fluorescent emission is CIE x≤0.18 and CIE y≤0.08, and the time it takes until the EL brightness of the front face decreases to 90% of the initial brightness when DC current is continuously supplied at a current density of 25 mA/cm$^2$ is at least 30 hours.

9. The organic electroluminescent element according to claim 1, wherein said organic electroluminescent element has a pair of electrodes, one of the pair of electrodes is an electrode with a visible light transmissivity of less than 10%, and the other is an electrode with a visible light transmissivity of at least 80%.

10. A light-emitting device featuring the organic electroluminescent element according to claim 1.

11. A display device featuring the organic electroluminescent element according to claim 1.

12. A lighting device featuring the organic electroluminescent element according to claim 1.

* * * * *